US 6,639,471 B2

(12) United States Patent
Matsuura et al.

(10) Patent No.: US 6,639,471 B2
(45) Date of Patent: Oct. 28, 2003

(54) POWER AMPLIFIER CIRCUIT, CONTROL METHOD FOR POWER AMPLIFIER CIRCUIT, AND PORTABLE TERMINAL APPARATUS FOR MOBILE COMMUNICATION

(75) Inventors: Toru Matsuura, Katano (JP); Hisashi Adachi, Minoo (JP); Makoto Sakakura, Uji (JP); Hiroyuki Handa, Hirakata (JP); Toshio Obara, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 36 days.

(21) Appl. No.: 10/123,735

(22) Filed: Apr. 16, 2002

(65) Prior Publication Data

US 2002/0175764 A1 Nov. 28, 2002

(30) Foreign Application Priority Data

Apr. 16, 2001 (JP) ......................... 2001-117418

(51) Int. Cl.[7] ............................................... H03F 3/04
(52) U.S. Cl. ...................... 330/302; 330/285; 330/297
(58) Field of Search ................................ 330/285, 296, 330/297, 302, 129, 136; 327/307

(56) References Cited

U.S. PATENT DOCUMENTS

| 5,548,247 A | * | 8/1996 | Ogino et al. ................. 330/277 |
| 5,905,409 A | * | 5/1999 | Fujimoto et al. ............ 330/302 |
| 6,114,911 A | * | 9/2000 | Iwai et al. .................... 330/295 |

FOREIGN PATENT DOCUMENTS

JP          10-341117          12/1998

* cited by examiner

Primary Examiner—Henry Choe
(74) Attorney, Agent, or Firm—RatnerPrestia

(57) ABSTRACT

To provide a power amplifier circuit with a smaller circuit scale and with good characteristics over a wide range of load impedance. A configuration includes: a DC/DC converter 2108 which delivers a supply voltage from a battery 2111 to a power amplifier 1302 according to control commands from a control circuit 2109; a directional coupler 2101 which outputs a signal from one terminal 2101a according to signal waves received by an antenna 1306 from a second matching circuit 105 and outputs a signal from another terminal 2101b according to reflected waves received from the antenna 1306; and detectors 2102 and 2103 or the like.

12 Claims, 16 Drawing Sheets

Fig. 12 (A) PRIOR ART
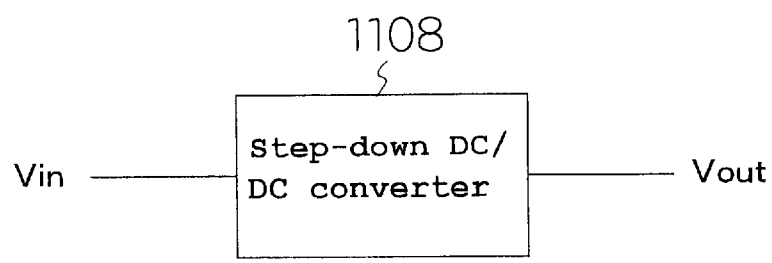
Fig. 12 (B) PRIOR ART
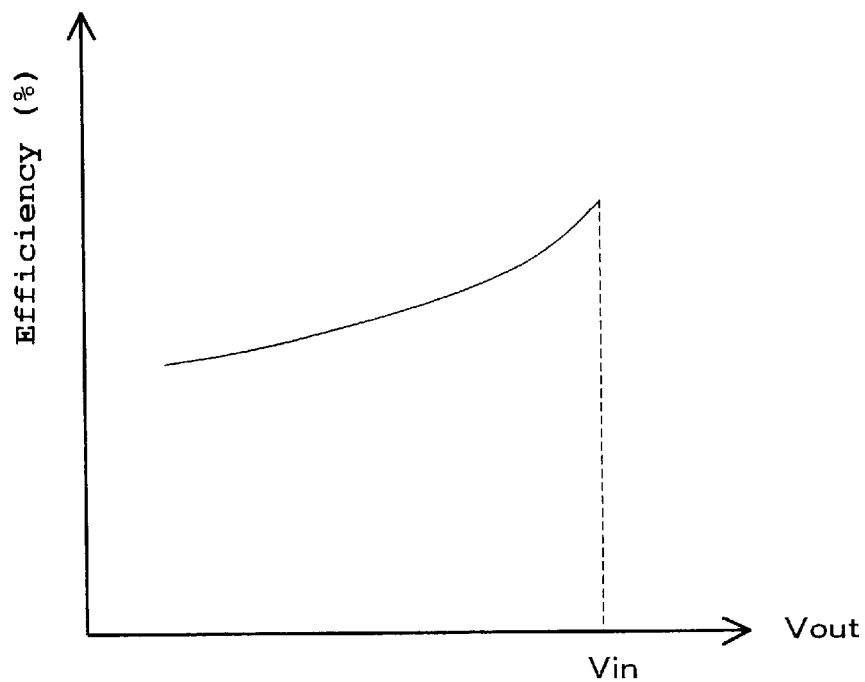

POWER AMPLIFIER CIRCUIT, CONTROL METHOD FOR POWER AMPLIFIER CIRCUIT, AND PORTABLE TERMINAL APPARATUS FOR MOBILE COMMUNICATION

BACKGROUND OF THE INVENTION

1. Field of the Invention

The present invention relates to a high efficiecy power amplifier circuit with a wide dynamic range, a control method for the power amplifier circuit, and a portable terminal apparatus for mobile communication.

2. Description of the Related Art

For example, CDMA portable terminals are seldom operated at maximum power, but are often operated at 10 to 20 dB lower power. Thus, in order to extend battery life of terminals, it is important to reduce power consumption during such low power operation.

FIG. 11 shows a conventional power amplifier which can reduce power consumption during such low power operation.

In FIG. 11, the power amplifier consists of an input terminal 1101, output terminal 1102, matching circuit 1103, transistor 1104, matching circuit 1105, bias circuit 1106, bias circuit 1107, step-down DC/DC converter 1108, and control means 1109.

The conventional power amplifier impedance-matches an input signal entered from the input terminal 1101 using the matching circuit 1103, amplifies the signal using the transistor 1104, impedance-matches the signal using the matching circuit 1105, and outputs the signal from the output terminal 1102.

The step-down DC/DC converter 1108 adjusts the supply voltage fed from a power supply terminal 1111 by lowering an output voltage to be delivered to the bias circuit 1107, under the control of the control means 1109.

Specifically, the conventional power amplifier achieves high efficiency with a wide dynamic range by using the step-down DC/DC converter 1108, which sets the collector or drain voltage of the transistor 1104 to a value equal to or slightly lower than the supply voltage from the voltage supply terminal 1111 when the output power from the output terminal 1102 is high and sets the collector or drain voltage of the transistor 1104 to a value much lower than the supply voltage from the voltage supply terminal 1111 when the output power from the output terminal 1102 is low. Thus, conventionally, the collector or drain voltage of the transistor has never been used at a level higher than the supply voltage.

Besides, with the power amplifier used for CDMA or other portable terminals, an isolator is placed between the power amplifier and an antenna to reduce load variations in the power amplifier.

FIG. 13 shows such a conventional power amplifier 1302.

During reception, an antenna switch (or antenna duplexer) 1304 outputs signals received by an antenna 1306 to an output terminal 1305 for received signals.

During transmission, the power amplifier 1302 amplifies transmitted signals entered from an input terminal 1301 for transmitted signals and outputs them to an isolator 1303, which in turn sends the output of the power amplifier 1302 to the antenna switch (or antenna duplexer) 1304, which then routes the output of the isolator 1303 to the antenna 1306.

Antenna 1306 load will change during transmission, for example, due to causes such as a human body approaching the antenna 1306. However, even if the antenna load changes in this way, the isolator 1303 placed between the power amplifier 1302 and antenna switch (or antenna duplexer) 1304 keeps the load on the output side of the power amplifier 1302 virtually almost constant.

FIG. 12B shows characteristics of the step-down DC/DC converter 1108 used in the power amplifier shown in FIG. 11. FIG. 12A shows the step-down DC/DC converter 1108, where reference character Vin denotes an input voltage fed to the step-down DC/DC converter 1108 from a power supply connected to the power supply terminal 1111 while reference character Vout denotes an output voltage produced by the step-down DC/DC converter 1108.

Specifically, in FIG. 12B, on the condition that the input voltage Vin is constant, the horizontal axis represents the output voltage Vout and the vertical axis represents efficiency (%) of the step-down DC/DC converter 1108. The efficiency here is the percent ratio of output power Pout to input power Pin when the input voltage Vin is applied to the power supply terminal 1111 and the output voltage Vout is produced. In short, the efficiency is given by Pout/Pin×100.

It can be seen from FIG. 12B that the efficiency lowers with decreases in the output voltage Vout of the step-down DC/DC converter 1108.

During the operation of the power amplifier shown in FIG. 11, actually the output power from the output terminal 1102 is relatively low in most cases. When the output power is low, so is the output voltage of the step-down DC/DC converter 1108. Therefore, as can be seen from FIG. 12B, when the power amplifier produces low output power, the voltage conversion ratio of the step-down DC/DC converter 1108 is high. In such cases, the conversion efficiency of the step-down DC/DC converter 1108 lowers. Since the conversion efficiency of the step-down DC/DC converter 1108 lowers under low power conditions in which the power amplifier is used frequently, there is not much reduction in power consumption.

That is, a problem with the conventional power amplifier is that its power consumption cannot be reduced due to the lowered conversion efficiency of the step-down DC/DC converter.

On the other hand, the isolator 1303 placed between the power amplifier 1302 and antenna switch (or antenna duplexer) 1304, described with reference to FIG. 13, poses a problem of increased circuit scale.

Also, the isolator 1303 causes a power loss of approximately 0.2 to 0.8 dB, for example. Thus, although load variations of the power amplifier 1302 can be reduced, the output power of the power amplifier 1302 must be increased to make up for the power loss caused by the isolator 1303. This results in increased power consumption.

That is, a problem with conventional power amplifier is that the isolator causes power loss, which when compensated for, results in increased power consumption.

SUMMARY OF THE INVENTION

In view of the problems with the conventional power amplifier described above, an object of the present invention is to provide a power amplifier circuit with a smaller circuit scale and with good characteristics over a wide range of load impedance, a control method for the power amplifier circuit, and a portable terminal apparatus using the power amplifier circuit. Another object of the present invention is to provide a highly efficient power amplifier circuit with a wide dynamic range, a control method for the power amplifier circuit, and a portable terminal apparatus using the power amplifier circuit.

The 1st invention of the present invention is a power amplifier circuit, comprising:
- a first matching circuit which impedance-matches incoming input signals before outputting them;
- a first bias circuit connected to an output of said first matching circuit;
- a transistor connected to the output of said first matching circuit;
- a second bias circuit one end of which is connected to the output of said transistor;
- a second matching circuit which is connected to the output of said transistor and impedance-matches output signals of said transistor before outputting them;
- voltage transformation means whose output is connected to the other end of said second bias circuit and whose input is connected with a power supply; and
- control means of controlling operation of said voltage transformation means,
- wherein said power amplifier circuit further comprises load impedance detecting means of detecting the load impedance on the output side of said power amplifier circuit,
- said control means changes output voltage of said voltage transformation means based at least on the results of said detection by said load impedance detecting means, and
- said output voltage is applied to said transistor as a supply voltage.

The 2nd invention of the present invention is the power amplifier circuit according to 1st invention, further comprising an isolator disposed between said load impedance detecting means and an antenna.

The 3rd invention of the present invention is the power amplifier circuit according to 1st or 2nd inventions, wherein said load impedance detecting means comprises:
(1) a directional coupler which outputs a signal from one terminal according to received signal outputted from said second matching circuit to a load side and outputs a signal from the other terminal according to reflected waves inputted from said load side;
(2) a first detector which outputs data on the amplitude and phase of a signal outputted from said one terminal; and
(3) a second detector which outputs data on the amplitude and phase of a signal outputted from said other terminal.

The 4th invention of the present invention is the power amplifier circuit according to any one of 1st to 3rd inventions, wherein said control means controls the value of said supply voltage of said transistor according to the value of load impedance, which is the results of said detection by said load impedance detecting means.

The 5th invention of the present invention is the power amplifier circuit according to 4th invention, wherein said control means comprises storage means of storing, as a table, data which represents correspondence between the value of said load impedance and the value of said supply voltage and which is used for said control.

The 6th invention of the present invention is a power amplifier circuit, comprising:
- a first matching circuit which impedance-matches incoming input signals before outputting them;
- a first bias circuit connected to an output of said first matching circuit;
- a transistor connected to the output of said first matching circuit;
- a second bias circuit one end of which is connected to the output of said transistor;
- a second matching circuit which is connected to the output of said transistor and impedance-matches output signals of said transistor before outputting them;
- voltage transformation means whose output is connected to the other end of said second bias circuit and whose input is connected with a power supply; and
- control means of controlling operation of said voltage transformation means,
- wherein said voltage transformation means delivers output voltage under the control of said control means, and
- said control means determines according to output power from said power amplifier circuit whether to make said voltage transformation means carry out a step-up operation of raising said output voltage above a preset supply voltage or a step-down operation of lowering said output voltage below said supply voltage.

The 7th invention of the present invention is the power amplifier circuit according to 1st invention, wherein said control means controls the value of said supply voltage of said transistor according to the value of load impedance, which is the results of said detection by said load impedance detecting means, as well as to the value of output power of said power amplifier circuit.

The 8th invention of the present invention is the power amplifier circuit according to 7th invention, wherein said control means comprises storage means of storing, as a table in accordance with said output power, data which represents correspondence between the value of said load impedance and the value of said supply voltage and which is used for said control.

The 9th invention of the present invention is the power amplifier circuit according to 1st or 6th inventions, wherein said voltage transformation means is a DC/DC converter.

The 10th invention of the present invention is the power amplifier circuit according to 9th invention, wherein said DC/DC converter is of a step-up/step-down type.

The 11th invention of the present invention is a control method for a power amplifier circuit which comprises:
(1) a first matching circuit which impedance-matches incoming input signals before outputting them;
(2) a first bias circuit connected to an output of said first matching circuit;
(3) a transistor connected to the output of said first matching circuit;
(4) a second bias circuit one end of which is connected to an output of said transistor;
(5) a second matching circuit which is connected to the output of said transistor and impedance-matches output signals of said transistor before outputting them;
(6) voltage transformation means whose output is connected to the other end of said second bias circuit and whose input is connected with a power supply; and
(7) control means of controlling operation of said voltage transformation means,
wherein load impedance on the output side of said power amplifier circuit is detected,
said control means changes output voltage of said voltage transformation means based at least on said detected load impedance, and said output voltage is applied to said transistor as a supply voltage.

The 12th invention of the present invention is a portable terminal apparatus comprising:

an antenna used for transmission and reception;

transmitting circuit means including the power amplifier circuit according to 1st or 6th inventions for outputting transmission signals from said antenna;

receiving circuit means for processing received signals from said antenna; and transmission/reception separator circuit means installed between said antenna and said transmitting circuit means and said receiving circuit means.

BRIEF DESCRIPTION OF THE DRAWINGS

FIG. 12A is a block diagram showing a conventional step-down DC/DC converter;

FIG. 12B is a block diagram showing a relationship between an output voltage and an efficiency of the conventional step-down DC/DC converter;

DESCRIPTION OF SYMBOLS

Figure 1:
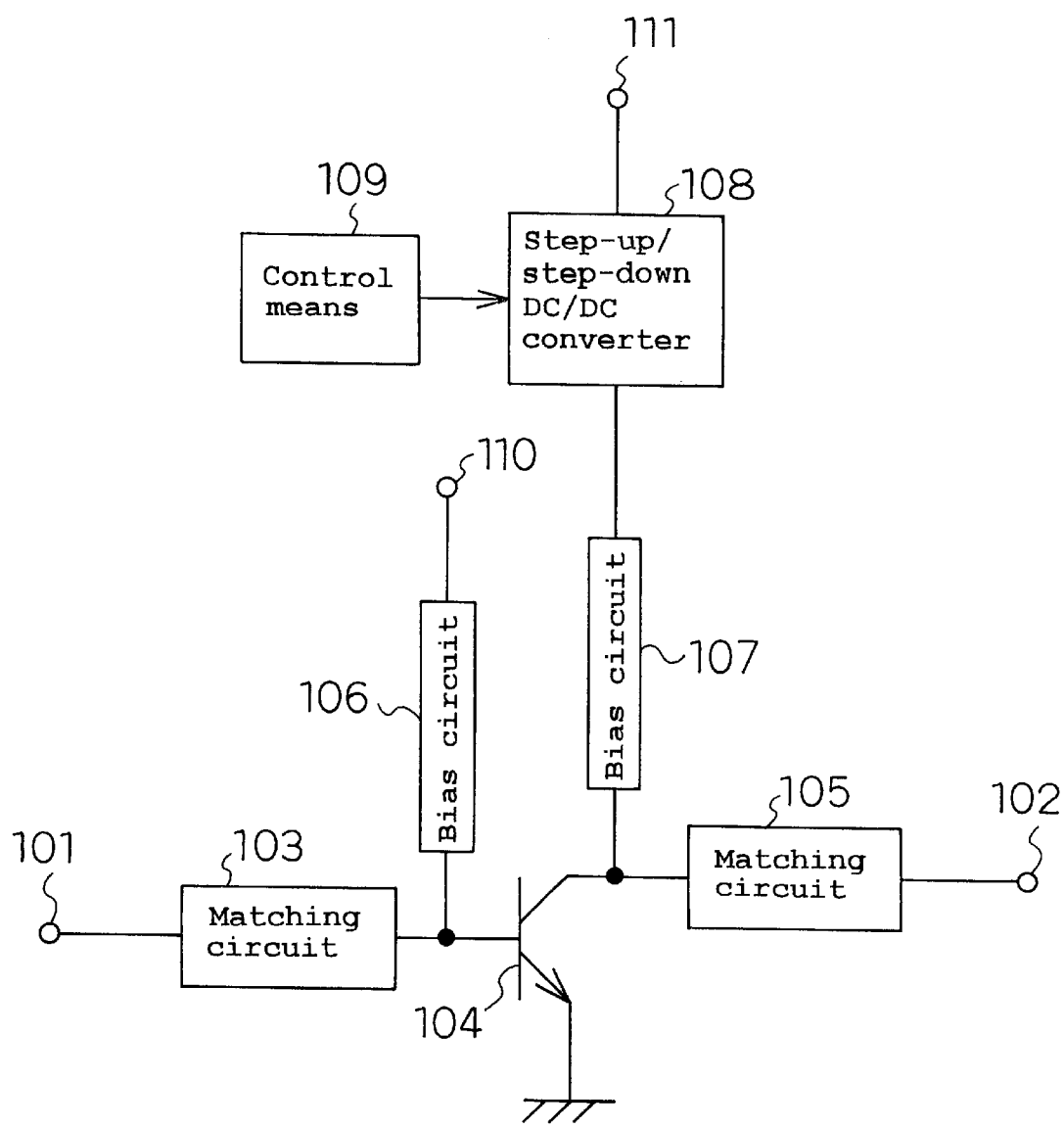
FIG. 1 is a block diagram of a power amplifier (power amplifier circuit) according to a first embodiment of a technology related to the present invention.

101 Input terminal
102 Output terminal
103, 105 Matching circuit
104 Transistor
106, 107 Bias circuit
108 Step-up/step-down DC/DC converter
109 Control means
110, 111 Power supply terminal
201 Input terminal
202 Output terminal
203, 205 Matching circuit
204 Transistor
206, 207 Bias circuit
208 Step-up/step-down DC/DC converter
209 Control means
210, 211 Power supply terminal
212 divider
213 detector
301 Input terminal
302 Output terminal
303, 305 Matching circuit
304 Transistor
306, 307 Bias circuit
308 Step-up/step-down DC/DC converter
309 Control means
310, 311 Power supply terminal
312 divider
313 detector
401 Input terminal
402 Output terminal
403, 404 Power amplifier
405, 406 Step-up/step-down DC/DC converter
407, 408 Power supply terminal
409 Control circuit
501 Input terminal
502 Output terminal
503, 505 Matching circuit
504 Transistor
506, 507 Bias circuit
508 Switch
509, 511 Step-up/step-down DC/DC converter
510, 512 Control means
513, 514, 515 Power supply terminal
1101 Input terminal
1102 Output terminal
1103, 1105 Matching circuit
1104 Transistor
1106, 1107 Bias circuit
1108 Step-down DC/DC converter
1109 Control means
1110, 1111 Power supply terminal

DETAILED DESCRIPTION OF THE PREFERRED EMBODIMENTS

The present invention will be described below mainly with reference to fourth, fifth, and sixth embodiments. First to third embodiments are embodiments of related technologies.

(First Embodiment)

Now, a first embodiment of technology related to the present invention will be described with reference to FIG. 1.

In FIG. 1, a transistor 104 has its input side and output side impedance-matched by a matching circuit 103 and matching circuit 105, respectively. A collector voltage is supplied from a power supply terminal 111 to the transistor 104 via a bias circuit 107 after being transformed by a step-up/step-down DC/DC converter 108. On the other hand, a base voltage is supplied from a power supply terminal 110 to the transistor 104 via a bias circuit 106.

Figure 8:
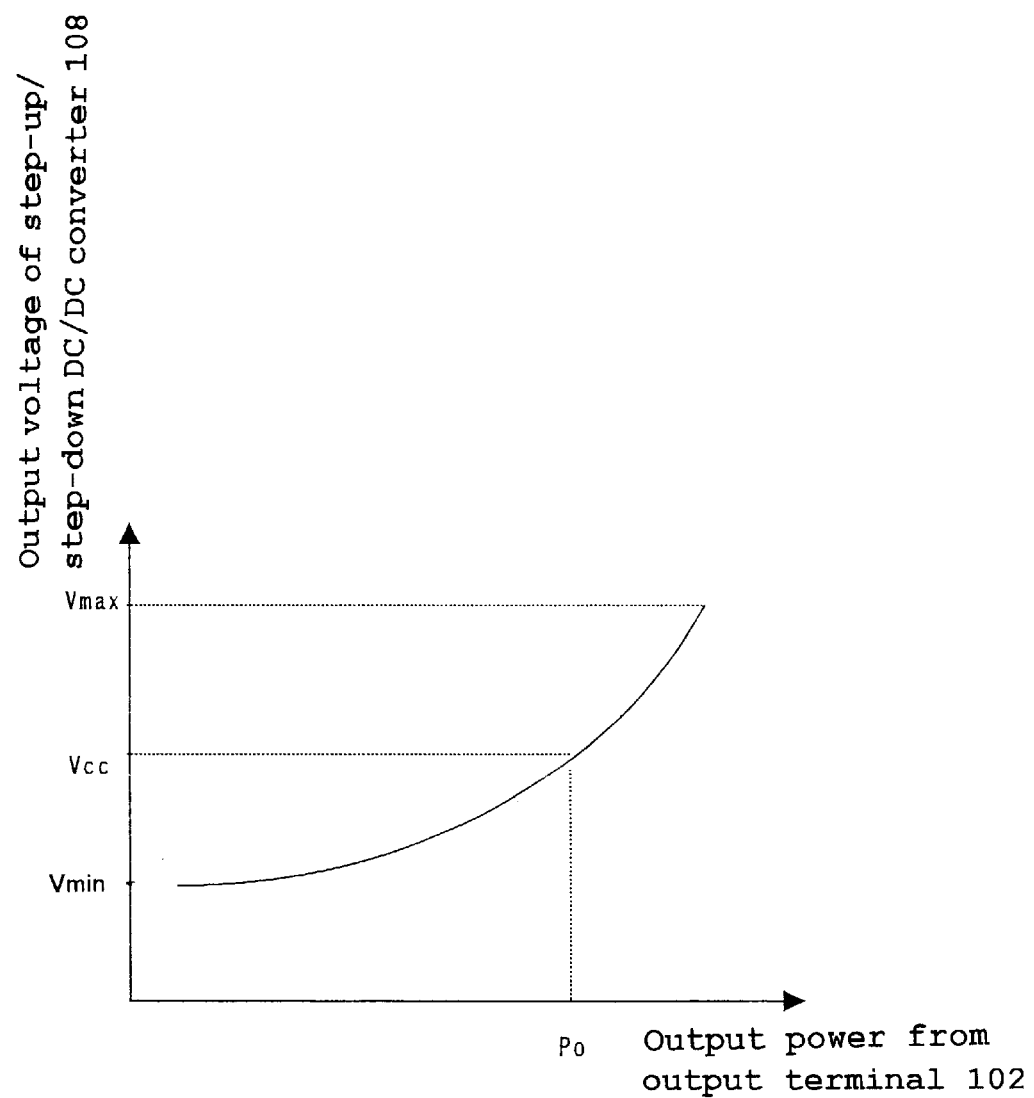
FIG. 8 is a diagram illustrating how a supply voltage is determined according to the first embodiment.

FIG. 8 shows a relationship between the output voltage of the step-up/step-down DC/DC converter 108 and the output power of an output terminal 102 according to this embodiment.

If a voltage supplied to the power supply terminal 111 is denoted by Vcc, the output voltage of the step-up/step-down DC/DC converter 108 is Vmax (>Vcc) when the output from the output terminal 102 is at its maximum. The output voltage of the step-up/step-down DC/DC converter 108 is reduced as the output from the output terminal 102 lowers.

As shown in FIG. 8, the voltage Vcc supplied to the power supply terminal 111 is set between Vmax described above and the minimum output voltage Vmin of the step-up/step-down DC/DC converter 108.

Thus, the step-up/step-down DC/DC converter 108 operates as a step-up converter when the output voltage is higher than a certain value $P_0$, and operates as a step-down converter when the output voltage is lower than $P_0$.

Consequently, if it is assumed that the minimum output voltage and the maximum output voltage delivered by the step-down DC/DC converter 1108 used in the conventional power amplifier are equal to those delivered by the step-up/step-down DC/DC converter 108 according to this embodiment, i.e., if it is assumed that the two converters have the same dynamic range, the step-up/step-down DC/DC converter 108 according to this embodiment has a smaller voltage conversion ratio than the step-down DC/DC converter 1108, and thus has a higher conversion efficiency accordingly.

This configuration can reduce the power consumption of the power amplifier by making it possible to improve the efficiency of the DC/DC converter under low power conditions in which the power amplifier is used frequently.

In this way, the power amplifier according to this embodiment can reduce power consumption more than the conventional power amplifier described with reference to FIG. 11 if the step-up/step-down DC/DC converter 108 has the same dynamic range as the conventional one.

When the conventional step-down DC/DC converter 1108 and the step-up/step-down DC/DC converter 108 according to this embodiment are compared, the difference between the maximum value and minimum value of the output voltage which provides the characteristics of the power amplifier above a minimum permissible value is larger in the case of the step-up/step-down DC/DC converter 108. That is, with the step-up/step-down DC/DC converter 108, the output voltage which makes the conversion efficiency higher than a minimum permissible value has a wider dynamic range. This can also contribute to reduction in power consumption. This will be described by comparing the conventional power amplifier described with reference to FIG. 11 and the power amplifier according to this embodiment.

First, the conventional power amplifier in FIG. 11 will be described in more detail.

Figure 9:
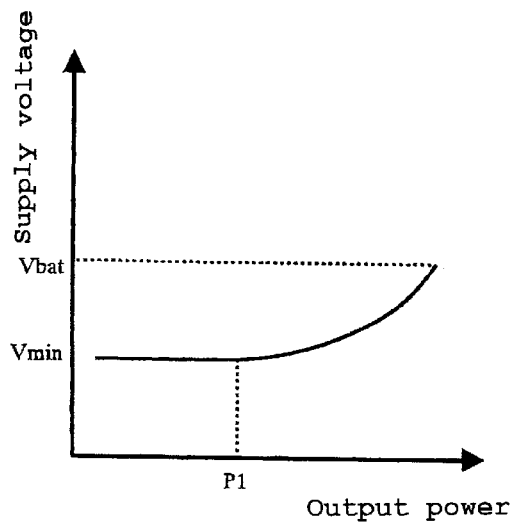
FIG. 9A is a diagram showing a relationship between an output voltage and a supply voltage of a conventional power amplifier which is compared with the power amplifier of the first embodiment.
FIG. 9B is a diagram showing a relationship between an output voltage and an efficiency of the conventional power amplifier which is compared with the power amplifier of the first embodiment.
Figure 9:
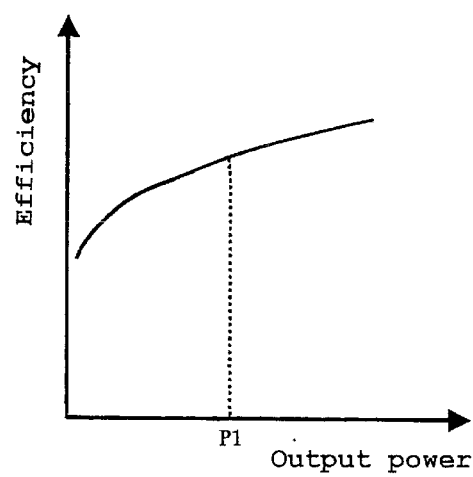

FIG. 9A shows a relationship between the output voltage of the conventional power amplifier described with reference to FIG. 11 and output voltage of the conventional step-down DC/DC converter 1108 while FIG. 9B shows a relationship between the output voltage and efficiency of the conventional power amplifier.

Figure 11:
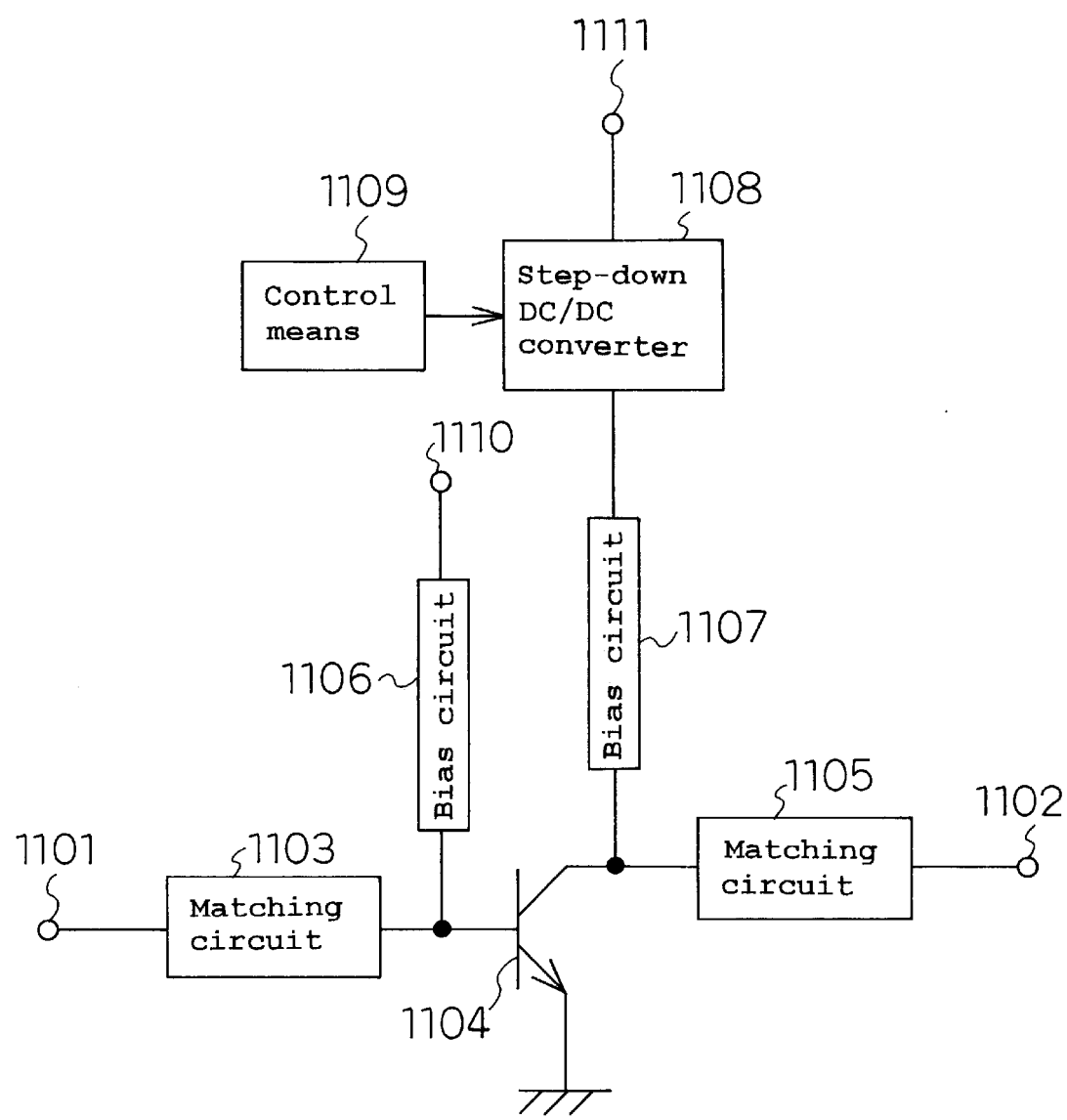
FIG. 11 is a diagram showing a configuration of the conventional power amplifier.

The conventional power amplifier shown in FIG. 11 uses the step-down DC/DC converter 1108 which produces output voltages by stepping down a supply voltage as described above. In FIG. 9A, if the supply voltage applied to the power supply terminal 1111 is denoted by Vbat and the minimum voltage for the transistor 1104 to operate properly is denoted by Vmin, the variable range of the collector voltage is between Vbat and Vmin. Incidentally, the minimum voltage Vmin for the transistor 1104 to operate properly is determined as follows.

Normally, when using a transistor for the purpose of power amplification, it is necessary to set the emitter voltage lower than the base voltage, and the collector voltage higher than the base voltage. Therefore, when the collector voltage is higher than the base voltage, it is possible up to a point to amplify power, but when the collector voltage approaches the base voltage, problems such as loss of gain will arise. Thus, the minimum collector voltage is set in such a range that amplified signals can be used practically without problems.

For example, the supply voltage of a lithium ion battery used today for cell phones and the like is 3.7 V. If the transistor used is a GaAs-HBT, when the base voltage is approximately 1.2 V, for example, the minimum voltage Vmin of the collector will be somewhere around 1.5 V.

When the output terminal 1102 of the power amplifier delivers the maximum power, a voltage of Vbat is supplied to the transistor 1104. If, for example, a lithium ion battery is used, Vbat is 3.7 V. Then, as the output from the output terminal 1102 of the power amplifier lowers, the step-down DC/DC converter 1108 lowers the supply voltage to maintain high efficiency.

However, when the output from the output terminal 1102 of the power amplifier lowers to a certain value P1, the collector voltage reaches Vmin. Incidentally, Vmin is approximately 1.5 V when the transistor used is a GaAs-HBT as described above. When the output from the output terminal 1102 lowers below P1, the efficiency of the power amplifier lowers as shown in FIG. 9B. Incidentally, the efficiency of the power amplifier here is the percent ratio of the output power to the power consumption of the power amplifier.

However, in the case of a CDMA system or the like, the output power of a power amplifier is controlled according to the distance from a base station. Specifically, control is performed such that the nearer the portable telephone terminal to the base station, the lower the output power of the power amplifier will be and that the output power of the power amplifier will be at its maximum near the range limit of a base station outside which the portable telephone cannot communicate with the base station. However, chances are slim that the power amplifier will deliver its maximum output power. It is likely that the output terminal 1102 of the power amplifier will be used under low power operation in most cases. Thus, it is important to improve the efficiency during low power operation. With the conventional power amplifier, however, the step-down DC/DC converter 1108 has low conversion efficiency when the output terminal 1102 of the power amplifier delivers low power as shown in FIG. 9B. This lowers the efficiency of the power amplifier as a result, and thus power consumption cannot be reduced enough.

Next, the power amplifier according to this embodiment will be described. Regarding the power amplifier according to this embodiment, FIG. 10A shows a relationship between the output voltage of the output terminal 102 and output voltage of the step-up/step-down DC/DC converter 108 while FIG. 10B shows a relationship between the output voltage of the output terminal 102 and efficiency of the power amplifier.

Regarding transistor size, the power amplifier according to this embodiment uses a smaller transistor than that of the conventional power amplifier when the maximum output power is the same.

Figure 10:
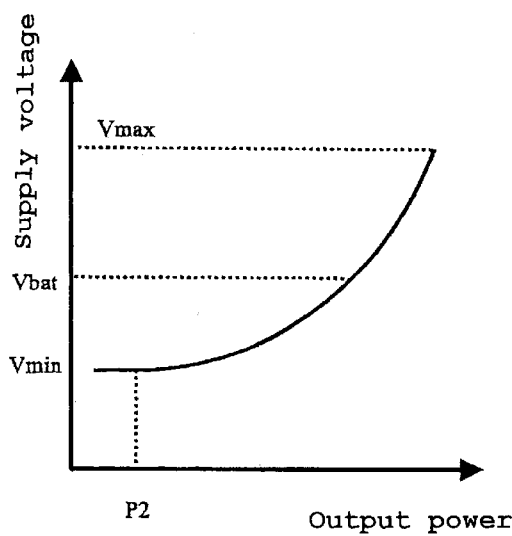
FIG. 10A is a diagram showing a relationship between an output voltage and a supply voltage of the power amplifier of the first embodiment.
FIG. 10B is a diagram showing a relationship between an output voltage and an efficiency of the power amplifier of the first embodiment.
Figure 10:
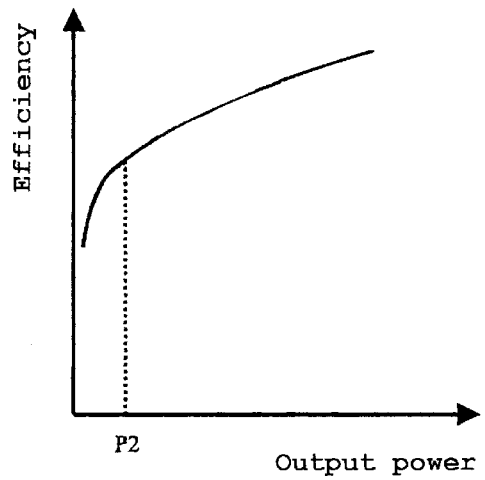

In FIG. 10A, if the supply voltage applied to the power supply terminal 111 shown in FIG. 1 is denoted by Vbat and the minimum voltage for the transistor 104 to operate properly is denoted by Vmin, the variable range of the collector voltage is between Vmin and Vmax, which is larger than Vbat.

When the output terminal 102 of the power amplifier delivers its maximum power, the voltage supplied to the transistor 104 is raised to Vmax by the step-up/step-down DC/DC converter 108. For example, if a lithium ion battery is used as a power supply, 3.7 V supplied to the power supply terminal 111 is raised to a value such as 5V or 6V by the step-up/step-down DC/DC converter 108. Thus, even with a smaller transistor, this power amplifier can deliver a maximum power equivalent to that of the conventional power amplifier.

With decreases in the power output from the output terminal 102 of the power amplifier, the output voltage of the step-up/step-down DC/DC converter 108 is lowered gradually.

When the step-up/step-down DC/DC converter 108 delivers its minimum output voltage Vmin, if the output power P2 from the output terminal 102 is compared with P1 in FIG. 1, the relationship P1>P2 holds because this embodiment uses a smaller transistor.

Furthermore, as described above, in the case of the step-up/step-down DC/DC converter 108, the output voltage has a wider dynamic range than in the case of the conventional step-down DC/DC converter 1108. Thus, as shown in FIG. 10B, when the output voltage from the output terminal 102 is P2, this power amplifier suffers smaller decreases in efficiency than the conventional configuration.

In this way, high efficiency can be maintained even at lower output power. This reduces the power consumption of the power amplifier and extends battery life.

Next, control methods of the step-up/step-down DC/DC converter 108 will be described. There are three possible methods.

A first method involves receiving information about the output power of the power amplifier from a baseband section and controlling the output voltage of the step-up/step-down DC/DC converter 108 by control means 109. That is, the baseband section outputs baseband signals, which consist of various signals and information, including signal data to be transmitted and output power information which specifies the output power. The output power information is used to control the gain of a gain control amplifier placed in a stage prior to the power amplifier. The control means 109 receives the output power information and controls the output voltage of the step-up/step-down DC/DC converter 108 based on this information as described above. In other words, the control means 109 detects input power to the transistor of the power amplifier based on the baseband signals outputted from the baseband section and controls the output voltage of the step-up/step-down DC/DC converter 108 according to the magnitude of the detected input power.

Figure 2:
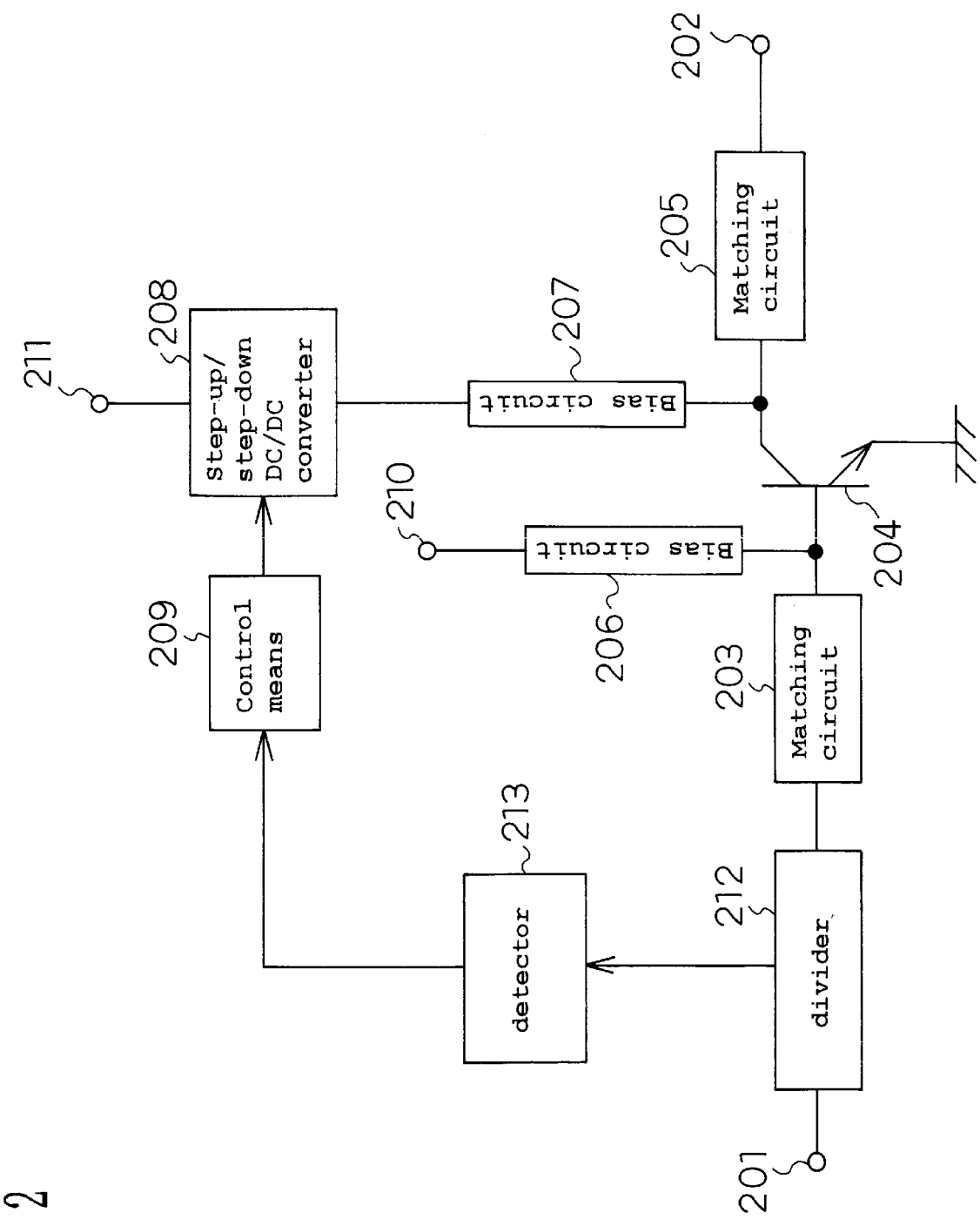
FIG. 2 is a block diagram of the power amplifier according to the first embodiment.

A second method will be described with reference to FIG. 2. In FIG. 2, in addition to the configuration shown in FIG. 1, part of an incoming signal is inputted by a divider 212 into a detector 213, which detects the magnitude of the input signal. Then, according to the magnitude of the input signal, control means 209 controls the output voltage of a step-up/step-down DC/DC converter 208. Specifically, the larger the magnitude of the input signal, the higher the control means 209 raises the output voltage of the step-up/step-down DC/DC converter 208.

Figure 3:
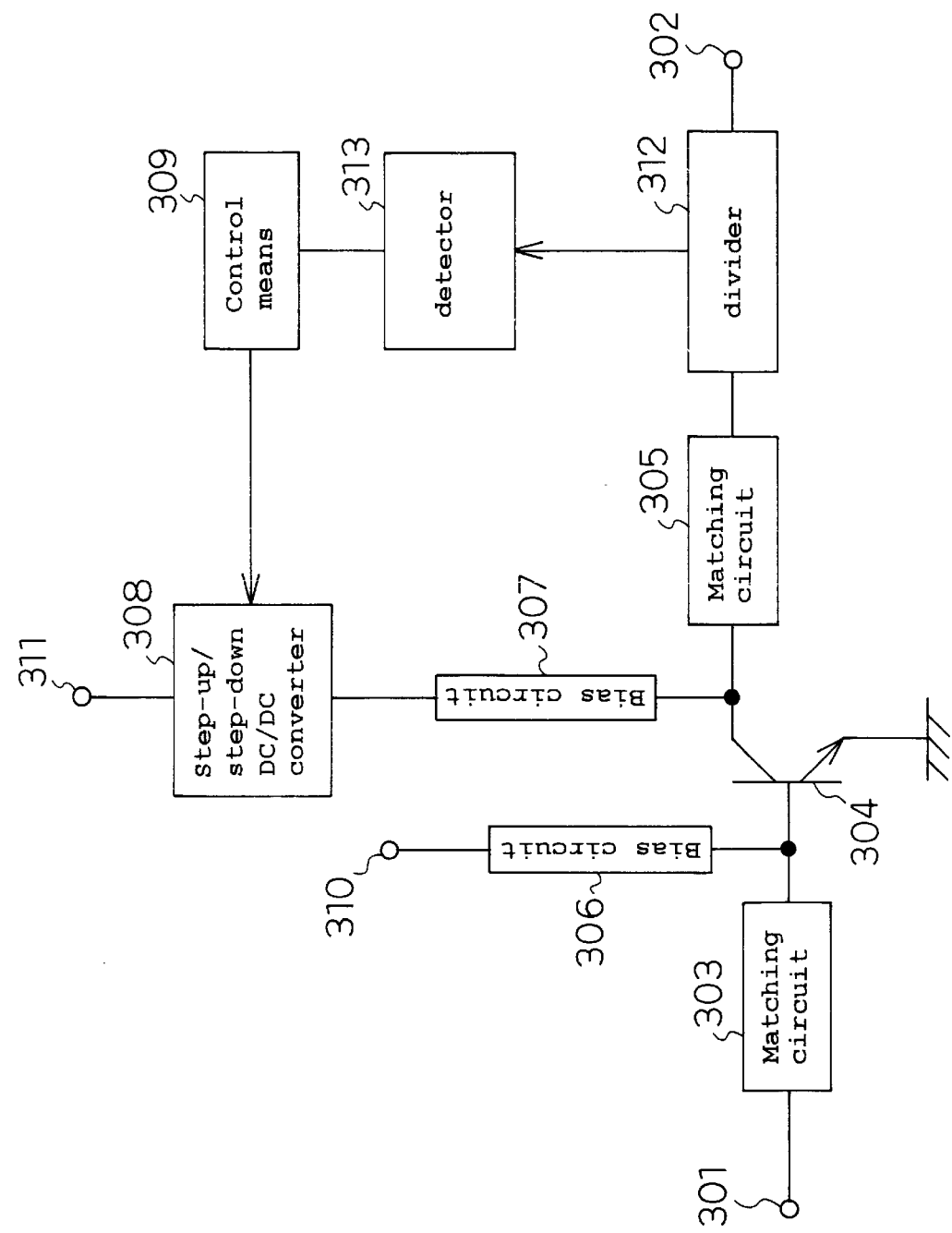
FIG. 3 is a block diagram of the power amplifier according to the first embodiment.

A third method will be described with reference to FIG. 3. In FIG. 3, in addition to the configuration shown in FIG. 1, part of an outputted signal is inputted by a divider 312 into a detector 313, which detects the magnitude of the output signal. Then, according to the magnitude of the output signal, control means 309 controls the output voltage of a step-up/step-down DC/DC converter 308. Specifically, the larger the magnitude of the output signal, the higher the control means 309 raises the output voltage of the step-up/step-down DC/DC converter 308.

Although methods for controlling the output voltage of the step-up/step-down DC/DC converters 108, 208 and 308 according to the magnitude of output signals have been described above, it may be controlled according to the type of modulation. For example, in the case of GMSK or other constant-envelope modulating signals, the output voltage of the step-up/step-down DC/DC converter 108, 208, or 308 is controlled so that the power amplifier will operate around its saturation power while in the case of EDGE or other modulating signals which are required of linearity, the output voltage of the step-up/step-down DC/DC converter 108, 208, or 308 is controlled so that the power amplifier will operate at power not higher than its saturation power to provide the desired linearity.

Although it has been assumed above that the matching circuits 103, 105, 203, 205, 303, and 305 are fixed circuits, optimum load conditions will change with changes in the output voltage of the step-up/step-down DC/DC converter 108, 208, or 308. Thus, when the output voltage of the step-up/step-down DC/DC converter 108, 208, or 308 changes, maximum efficiency can be obtained by controlling the input-side matching circuit 103, 203, or 303 and/or output-side matching circuit 105, 205, or 305.

Incidentally, similar control may be performed when the carrier frequency changes.

Figure 4:
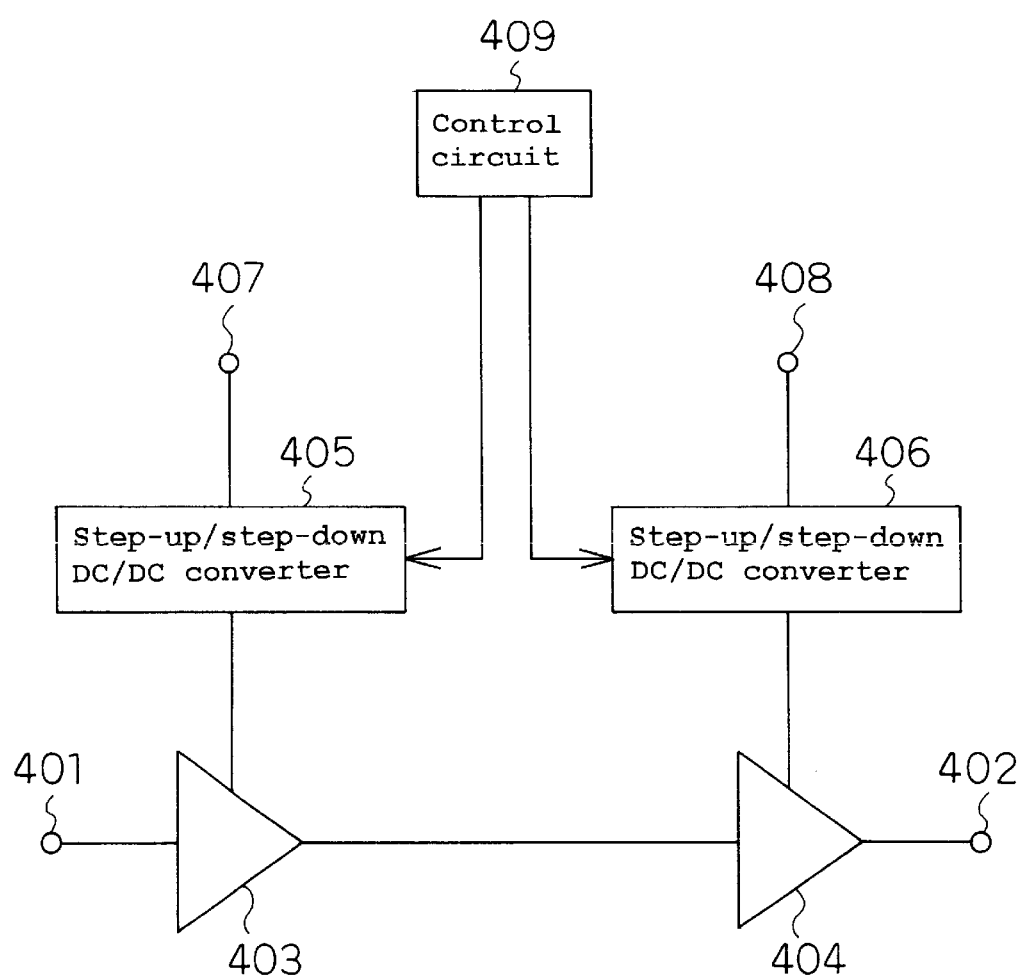
FIG. 4 is a block diagram of the power amplifier according to the first embodiment.

FIG. 4 shows a configuration which consists of two power amplifiers—such as the one shown in FIG. 1—connected in series. A signal entering an input terminal 401 is amplified by a power amplifier 403, further amplified by a power amplifier 404, and outputted from an output terminal 402. The power amplifier 403 is supplied with power from a power supply terminal 407 via a step-up/step-down DC/DC converter 405 while the power amplifier 404 is supplied with power from a power supply terminal 408 via a step-up/step-down DC/DC converter 406. By controlling two separate step-up/step-down DC/DC converters in this way, it is possible to provide high efficiency operation as a whole.

Although the power amplification in FIG. 4 uses two power amplifiers connected in series, three or more power amplifiers may be connected in series.

(Second Embodiment)

Figure 5:
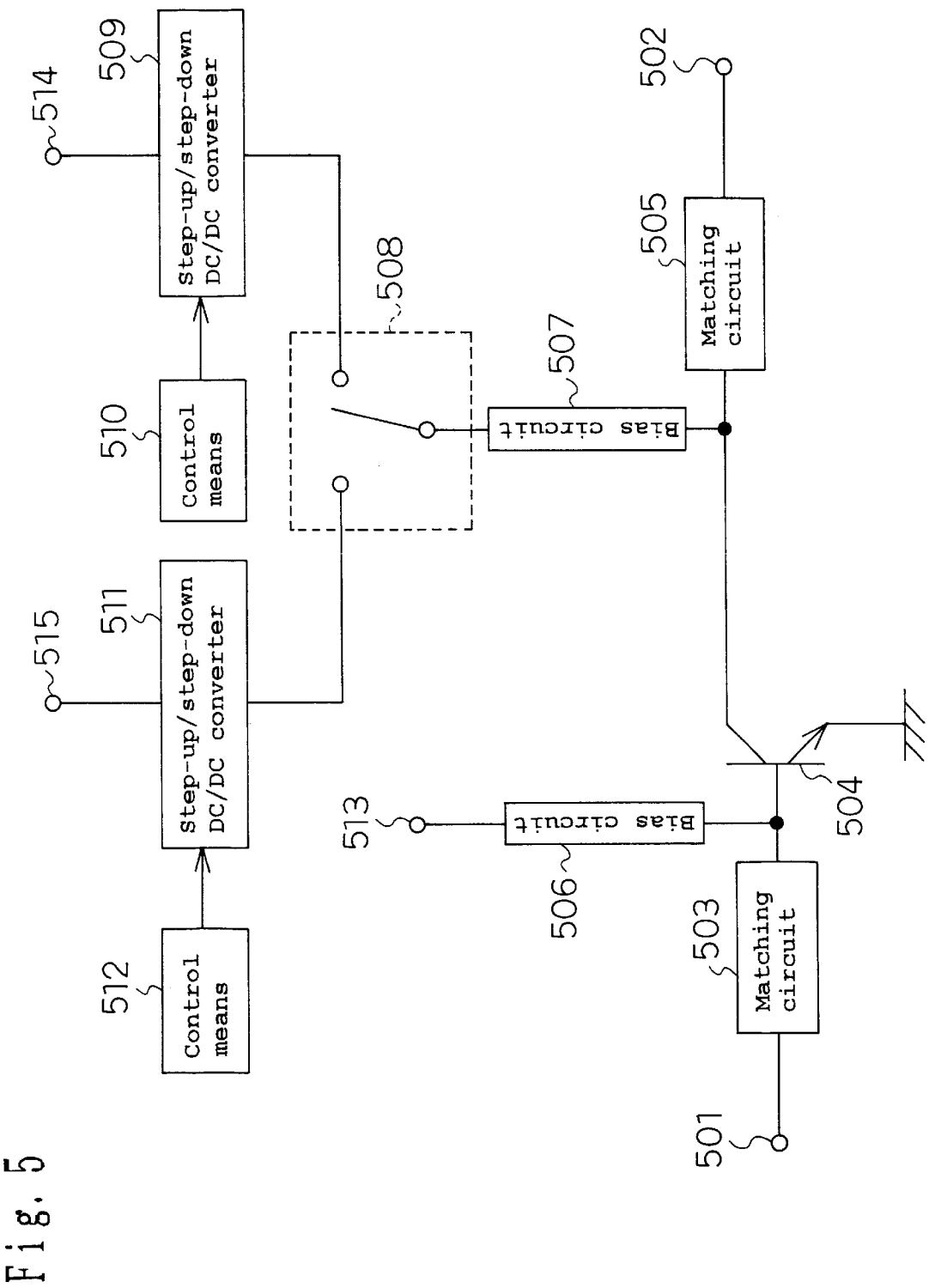
FIG. 5 is a block diagram of the power amplifier according to the first embodiment.

Now, a second embodiment will be described with reference to FIG. 5. In FIG. 5, a transistor 504 has its input side and output side impedance-matched by a matching circuit 503 and matching circuit 505, respectively. A collector voltage is supplied from a power supply terminal 514 to a switch 508 after being transformed by a step-up/step-down DC/DC converter 509 while another collector voltage is supplied from a power supply terminal 515 to another contact of the switch 508 after being transformed by a step-up/step-down DC/DC converter 511. The switch 508 supplies the output of the step-up/step-down DC/DC converter 509 or step-up/step-down DC/DC converter 511 to a bias circuit 507. On the other hand, a base voltage is supplied from a power supply terminal 513 to the transistor 504 via a bias circuit 506.

Figure 6:
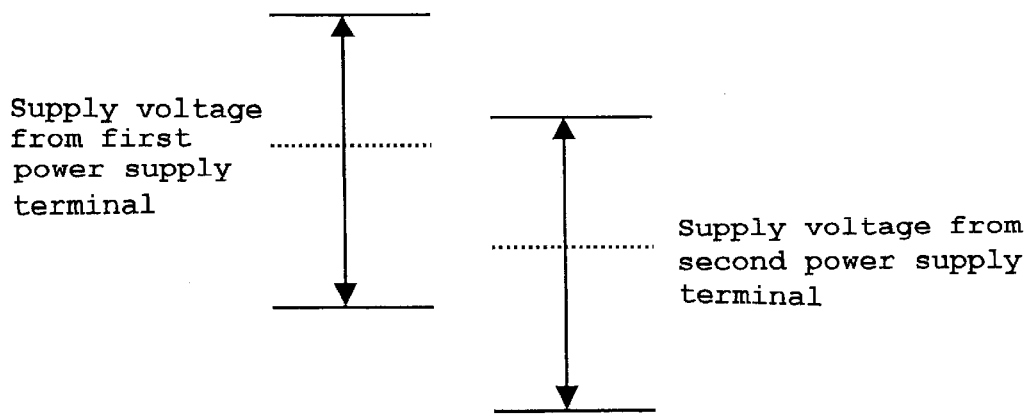
FIG. 6 is a diagram illustrating a variable range of a voltage according to a second embodiment of technology related to the present invention.

Operation will be described next. To amplify a first modulating signal, the bias circuit 507 and step-up/step-down DC/DC converter 511 are connected by the switch 508 to supply power from the power supply terminal 515 and the output voltage of the step-up/step-down DC/DC converter 511 is controlled by a control circuit 512 according to the output power of the power amplifier. To amplify a second modulating signal, the bias circuit 507 and step-up/step-down DC/DC converter 509 are connected by the switch 508 to supply power from the power supply terminal 514 and the output voltage of the step-up/step-down DC/DC converter 509 is controlled by a control circuit 510 according to the output power of the power amplifier. In short, if the variable range of voltage varies with the modulating signal, the power amplifier is operated as follows: two supply voltages with different output voltages are provided as shown in FIG. 6 and the output voltages of the step-up/step-down DC/DC converters are controlled by switching the supply voltages with a low-loss switch.

By operating the power amplifier in this way, it is possible to reduce power consumption as a whole.

Incidentally, although switching is done here based on modulating signals, it is also possible to do switching based on output voltage or the frequency of transmitted signals.

Furthermore, switching may be done based on load variations on the output side of the power amplifier as described later.

(Third Embodiment)

A third embodiment will be described with reference to FIGS. 1 and 7.

The operation in FIG. 1 is as described in relation to the first embodiment. Now, settings of the power voltage will be described in more detail.

Figure 7:
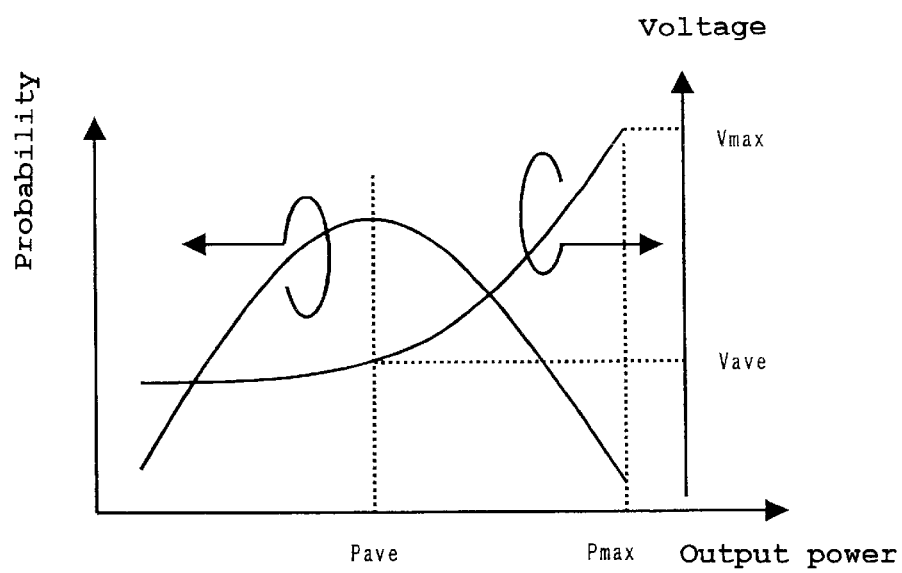
FIG. 7 is a diagram illustrating how a supply voltage is determined according to a third embodiment of a technology related to the present invention.

FIG. 7 shows the probable frequency of output power and corresponding output voltage of a step-up/step-down DC/DC converter. In the figure, the output power with the highest probable power is Pave and the corresponding output voltage of the step-up/step-down DC/DC converter is Vave. The maximum output power is Pmax and the output voltage of the step-up/step-down DC/DC converter at this time is Vmax. It is necessary to increase the conversion efficiency of the step-up/step-down DC/DC converter at Pave. It is also necessary to increase the conversion efficiency of the step-up/step-down DC/DC converter at Pmax, which involves large power consumption in delivering high power. Thus, by setting the supply voltage between Vave and Vmax, it is possible to implement a power amplifier which provides the highest efficiency as a whole.

In brief, the supply voltage needs only to be set to a value between the output voltage of the step-up/step-down DC/DC converter which corresponds to the maximum output power of the transistor and the output voltage of the step-up/step-down DC/DC converter which corresponds to the minimum output power of the transistor although this may result in a slightly lower efficiency than in the case of the third embodiment.

(Fourth Embodiment)

Now, detailed description will be given about how the efficiency of a power amplifier can be improved by eliminating an isolator from a power amplifier circuit of this embodiment.

Figure 13:
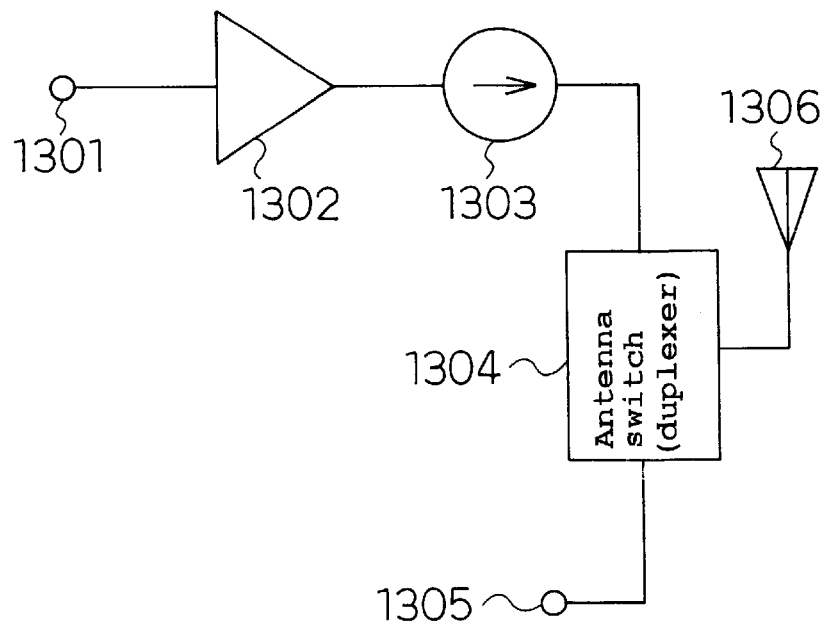
FIG. 13 is a diagram showing a conventional power amplifier which can reduce load variations using an isolator.

In the conventional power amplifier described with reference to FIG. 13, the isolator 1303 is inserted to reduce load variations on the output side of the power amplifier 1302. Consequently, when the output side is viewed from the power amplifier 1302, the load impedance is always adjusted to almost 50 ohms. However, the isolator 1303 causes power loss, which lowers the efficiency of the power amplifier 1302 as a result. This has been described in "Description of the Prior Art."

Suppose the isolator 1303 is removed to reduce the power loss on the output side of the power amplifier 1302 or to reduce the number of parts. Then, load variations on the output side of the power amplifier 1302 will increase VSWR (Voltage Standing-Wave Ratio). The load variations on the output side will be affect directly to the power amplifier 1302, degrading the distortion characteristics of the power amplifier 1302.

That is, this is because transistors have the property that when the load on the output side changes, output signals from the transistors will become highly distorted.

Also, transistors such as the transistor 104 in FIG. 1 generally have the property that the larger the voltage applied to the collector or drain, the smaller the distortion contained in the output signals of the transistors. That is, distortion characteristics are improved with increases in the voltage applied to the collector or drain.

Another configuration example using the power amplifier of FIG. 1, for example, involves detecting load values in output side and increasing the output voltage of the step-up/step-down DC/DC converter 108 according to load values.

Specifically, the control means 109 in FIG. 1 detects load values of the output terminal 102 and performs control such that the larger the load variations, i.e., the larger the deviation of the load impedance from 50 ohms, the higher the output voltage of the step-up/step-down DC/DC converter 108 will be. Then, load variations of the power amplifier will not lead to degradation of distortion characteristics even if no isolator is used.

Thus, even if the value of VSWR is large, since the output voltage of the step-up/step-down DC/DC converter 108 is raised, reducing distortion components contained in the output power of the output terminal 102 of the power amplifier, distortion of the power amplifier can be reduced.

Figure 14:
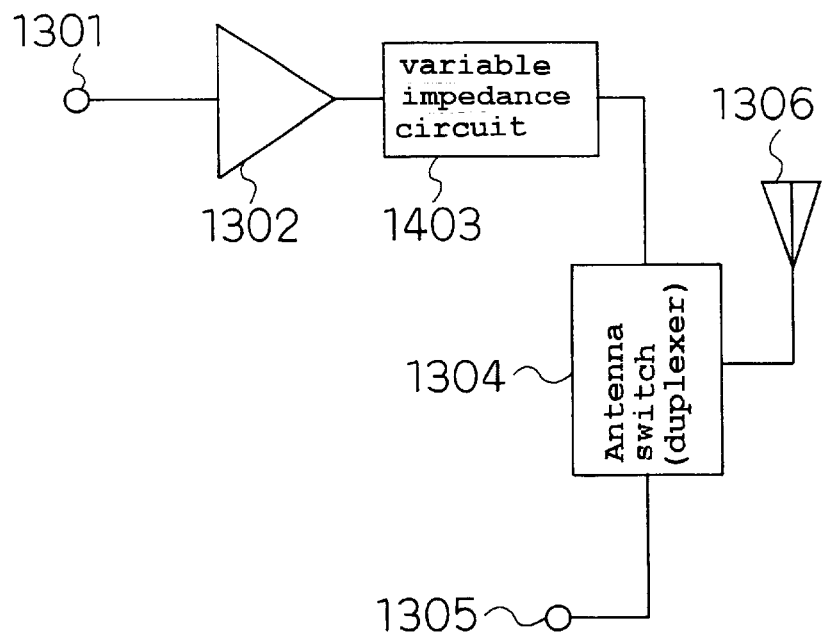
FIG. 14 is a diagram showing a conventional power amplifier circuit which reduces load variations using an variable impedance circuit instead of an isolator and which is provided for comparison purposes in describing a power amplifier circuit according to a fourth embodiment of the present invention.

FIG. 14 shows a conventional power amplifier circuit which does not employ any isolator. We consider the case that load variations produced when the isolator 1303 is removed from the power amplifier circuit of FIG. 13. The power amplifier circuit of FIG. 14 contains a variable impedance circuit 1403, which changes impedance according to the values in the load on the antenna 1306. That is, the variable impedance circuit 1403 changes antenna impedance according to the antenna 1306 load values to satisfy the specification when the load values of the power amplifier circuit changes.

However, the variable impedance circuit 1403 causes loss of output power. To compensate for the loss caused by the variable impedance circuit 1403, the output power of the transistor must be increased, which results in increased power consumption. Besides, it is difficult to adjust an entire impedance range by the variable impedance circuit 1403.

Thus, with respect to the power amplifier circuit of FIG. 14, this embodiment prevents degradation in the distortion characteristics of the power amplifier 1302 even in the presence of antenna 1306 load variations by increasing the collector or drain voltage of the transistor used in the power amplifier 1302 according to the antenna 1306 load values.

The above configuration applied to the power amplifier of FIG. 14 can be similarly applied to the power amplifiers of FIGS. 1 to 3. Specifically, with respect to the load variations on the output side of the power amplifiers in the first and second embodiments, efficiency degradation of the power amplifiers can be reduced by varying the output voltage of the step-up/step-down DC/DC converter 108, 208, and 308 and by controlling an impedance of the input-side matching circuit 103, 203, and 303 and/or output-side matching circuit 105, 205, and 305.

Incidentally, the matching circuits here have been configured to have the same function as the variable impedance circuit 1403.

Generally, the variable range of impedance and the loss caused by an impedance adjustment function trade off against each other. That is, providing a large variable range of impedance will increase the loss described above. In the configuration used here, the loss is small, but so is the variable range. The insufficiency in the variable range of impedance is compensated for by the use of the step-up/step-down DC/DC converter. This reduces distortion characteristics of the power amplifier as a whole, as described above.

In this way, the isolator can be removed from the power amplifier circuit, thereby further improving the efficiency of the power amplifier.

(Fifth Embodiment)

Regarding the fourth embodiment above, a brief description has been given about a configuration which involves detecting load variations of the output terminal 102 (FIG. 1) and controlling the output voltage of the step-up/step-down DC/DC converter 108 based on the results of the detection.

Figure 15:
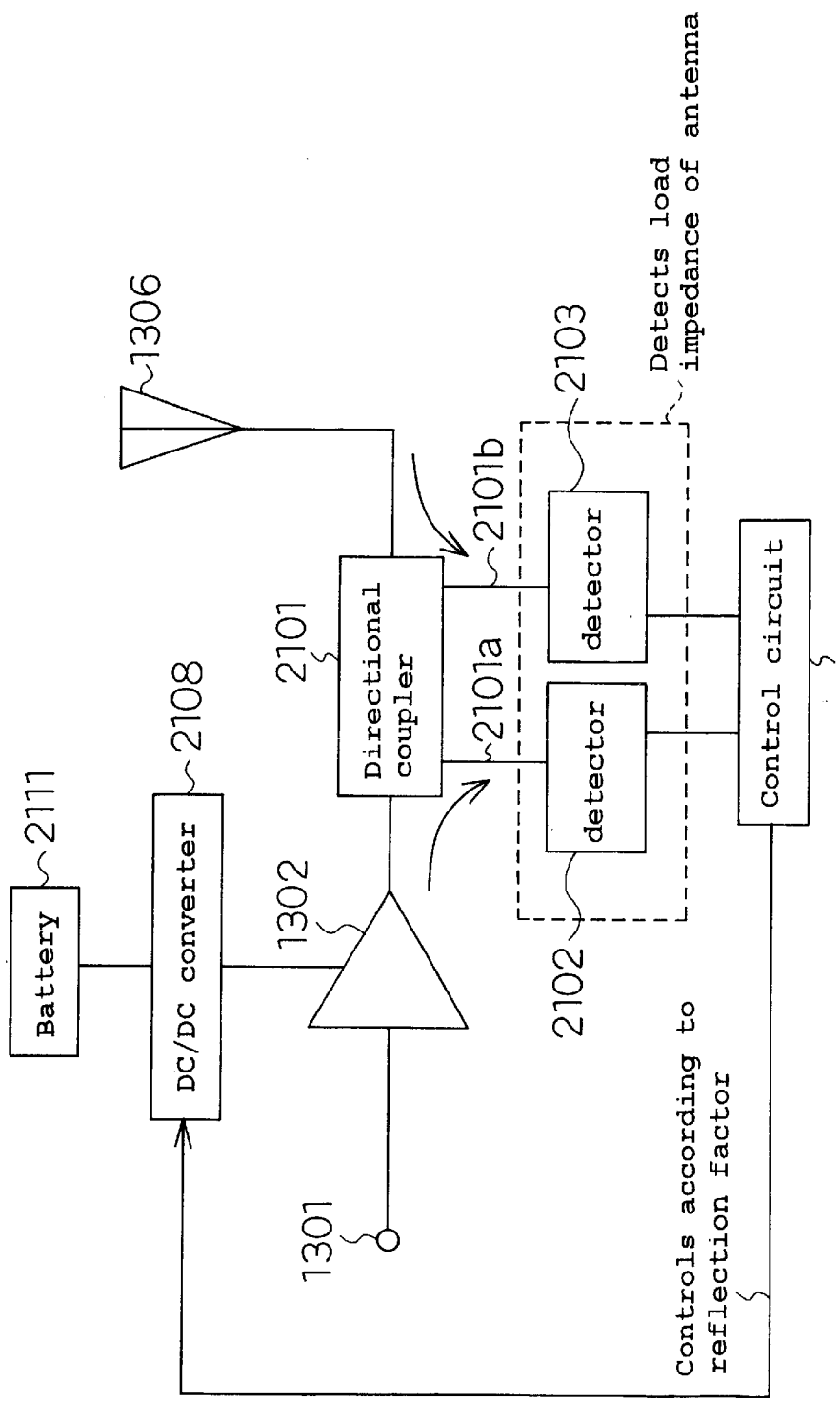
FIG. 15 is a block diagram of a power amplifier circuit according to a fifth embodiment of the present invention.

Now, description will be given about the configuration and operation of a power amplifier circuit according to a fifth embodiment of the present invention with reference to a more detailed block diagram. FIG. 15 is a block diagram showing the power amplifier circuit according to this embodiment. The same components as those in the above embodiments will be denoted by the same reference numerals as in the above embodiments and description thereof will be omitted.

Incidentally, together with the description about the operation of this embodiment, description will be given about an embodiment of an operating method for the power amplifier circuit of the present invention.

Referring to FIG. 15, a DC/DC converter 2108 provides means of delivering a supply voltage from a battery 2111 to the power amplifier 1302 according to control commands from a control circuit 2109. The power amplifier 1302 includes the first matching circuit 103, second matching circuit 105, first bias circuit 106, and second bias circuit 107, shown in FIG. 1.

A directional coupler 2101 provides means of outputting a signal from one terminal 2101a according to signal waves received by the antenna 1306 from the second matching circuit 105 as well as means of outputting a signal from another terminal 2101b according to reflected waves received from the antenna 1306. A detector 2102 is a first detector of the present invention which outputs data on the amplitude and phase of a signal outputted from the one terminal 2101a. A detector 2103 is a second detector of the present invention which outputs data on the amplitude and phase of a signal outputted from the other terminal 2101b.

The control circuit 2109 provides means of comparing the amplitudes as well as the phases between the input waves and reflected waves based on the output data from the detectors 2102 and 2103 and calculating the value of the load impedance on the antenna 1306 side. It also provides means of controlling the value of the output voltage of the DC/DC converter 2108, which is the value of the supply voltage of the power amplifier 1302, according to the value of the load impedance, which is the results of the calculation, as well as to the value of the output power of the power amplifier 1302. Furthermore, the control circuit 2109 comprises memory means (not shown) of storing, as a table (also referred to herein as a supply voltage map) in accordance with the above-mentioned output power, data which represents correspondence between the value of the load impedance and the value of the supply voltage and which is used for the above-mentioned control.

Figure 16:
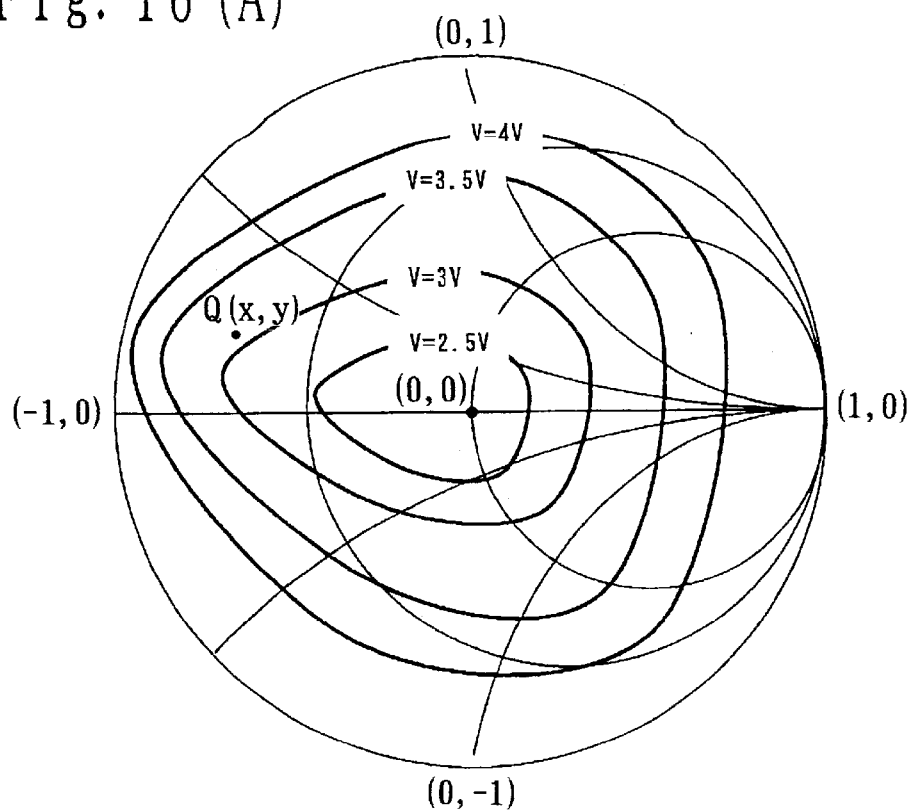
FIG. 16A is a supply voltage map for an output power of P1 in the fifth embodiment.
FIG. 16B is a supply voltage map for an output power of P2 in the fifth embodiment.
Figure 16:
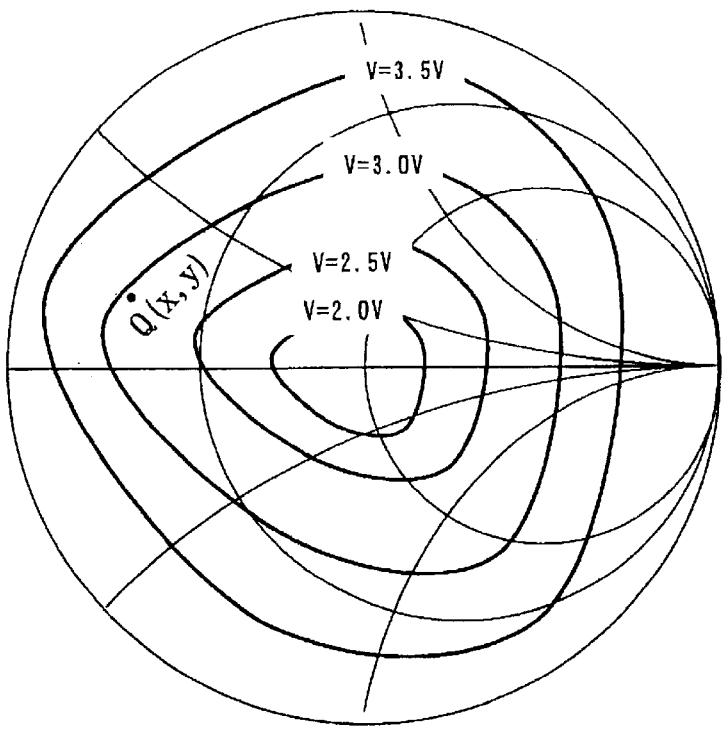

FIGS. 16A and 16B are conceptual diagrams illustrating the above table using a Smith chart. If the reflection factor of the load impedance is denoted by complex $\Gamma$ (gamma), the location on a Smith chart is determined for each $\Gamma$ value (real part, imaginary part). On the other hand, the scope of predetermined plurality of kinds of supply voltages to be supplied to the power amplifier 1302 has been assigned to the Smith chart. As shown in FIG. 16A, the supply voltage to be supplied tends to increase with increasing distance from the 50-ohm point (center of the circle). FIG. 16A is a supply voltage map for an output power of P1 while FIG. 16B is a supply voltage map for an output power of P2, where P1>P2. Two or more such supply voltage maps are provided according to output power.

If the supply voltage is controlled based only on load impedance, only one such table needs to be provided.

Now, description will be given about how the supply voltage is determined by the control circuit 2109, with reference to FIGS. 16A and 16B.

For example, suppose that load impedance is determined by the control circuit 2109 based on data from the wave detectors 2102 and 2103 under certain conditions. Suppose also that the reflection factor of the load impedance is Q and that the output power is P1.

In this case, a table which corresponds to the supply voltage map shown in FIG. 16A is used. The location of point Q on the Smith chart in FIG. 16A, which is determined uniquely, indicates that the supply voltage should be 3.5 V. However, if the output power is P2, from FIG. 16B the supply voltage should be 3.0 V, even if the reflection factor is also Q.

In this way, the configuration without an isolator allows good characteristics to be achieved over a wide range of load impedance using a smaller circuit scale than conventional ones.

(Sixth Embodiment)

Next, a power amplifier circuit according to another embodiment of the present invention will be described with reference to drawings.

Figure 17:
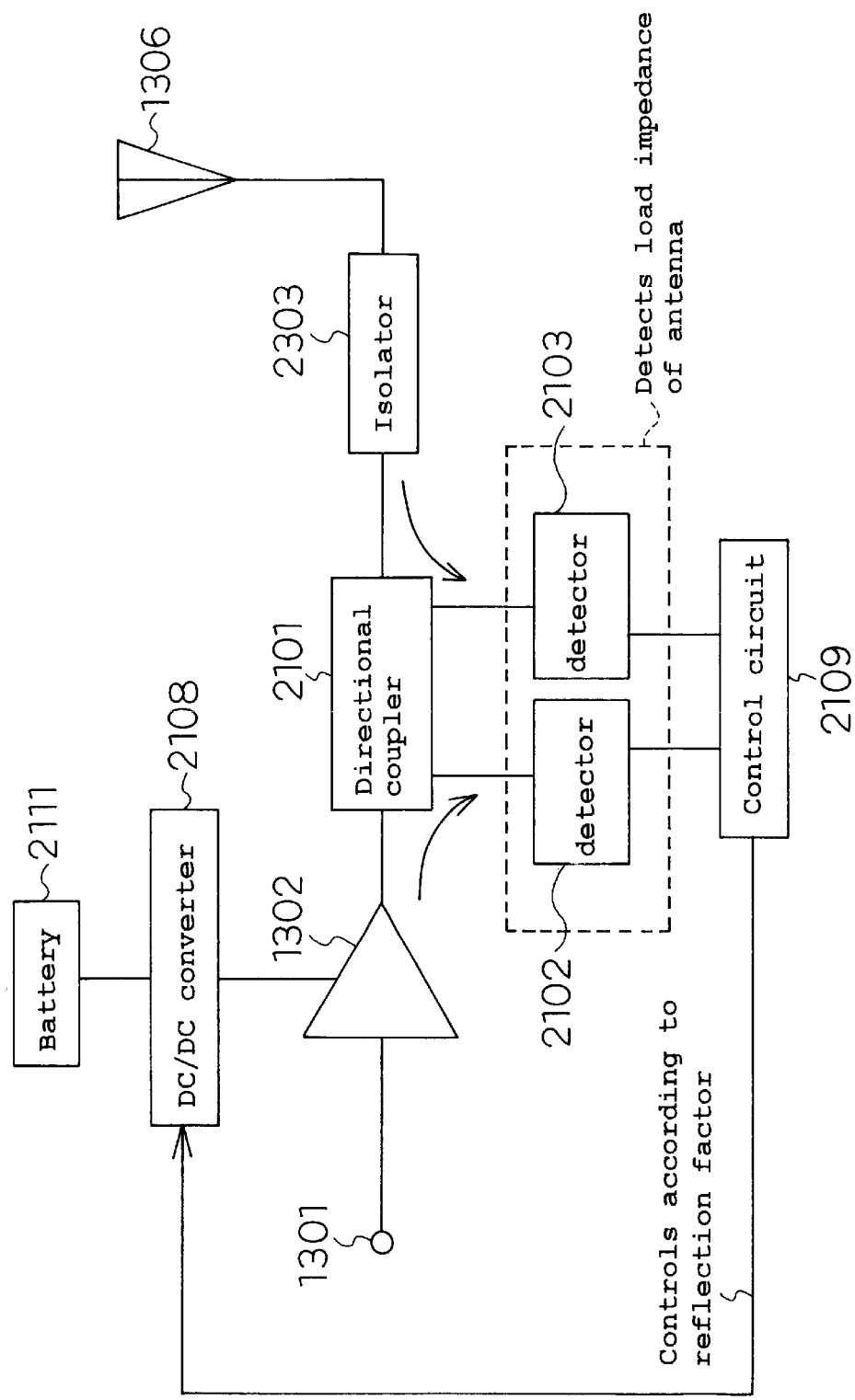
FIG. 17 is a block diagram of a power amplifier circuit according to a sixth embodiment of the present invention.

FIG. 17 is a block diagram of a power amplifier circuit according to this embodiment. The same components as those in FIG. 15 will be denoted by the same reference numerals as in FIG. 15 and description thereof will be omitted.

This configuration differs from that of the fifth embodiment above mainly in that it additionally comprises an isolator 2303.

The isolator 2303 in FIG. 17 is intended to reduce its own power loss and does not have a sufficient isolation function. Its inadequacies are compensated for by the directional coupler 2101, detectors 2102 and 2103, and control circuit 2109.

Figure 18:
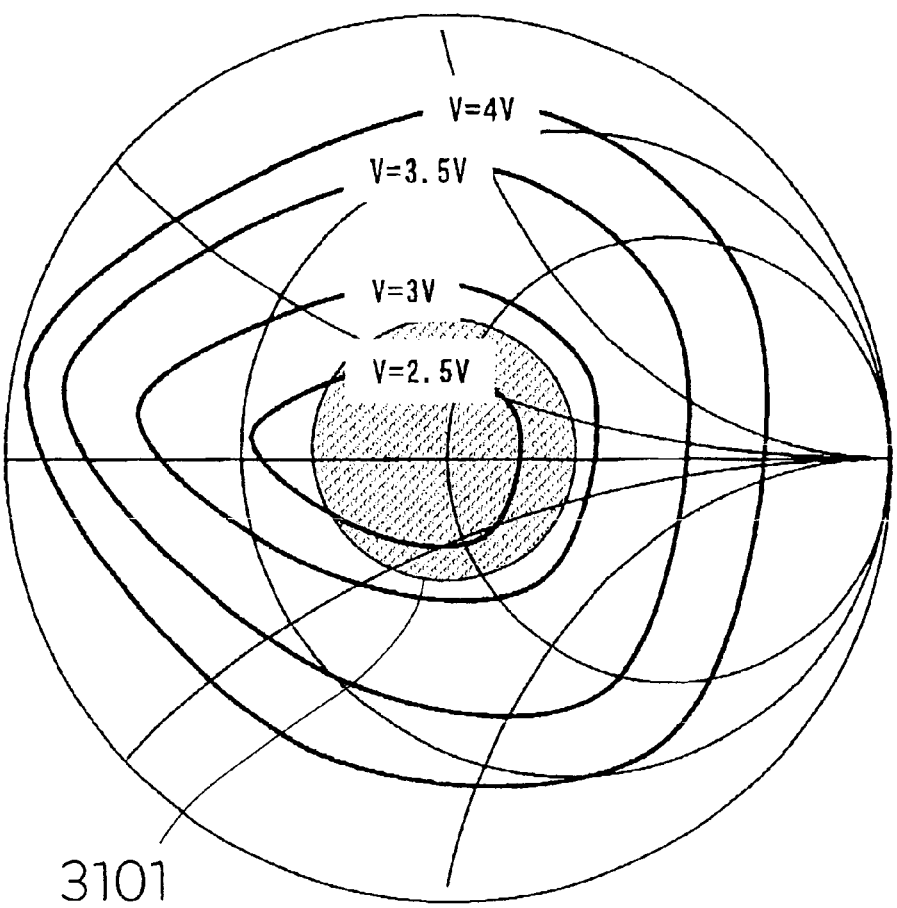
FIG. 18 is a supply voltage map for an output power of P1 in the sixth embodiment.

The supply voltage to be applied to the power amplifier 1302 can be made lower (FIG. 18) than in the case of the configuration in FIG. 15. FIG. 18 will be described later. Incidentally, whether the power consumption of the power amplifier circuit as a whole can be reduced depends on isolator performance.

FIG. 18 is a supply voltage map for an output power of P1 according to this embodiment.

Thanks to the effect of the isolator 2303, the range 3101 of the supply voltage to be applied fits in a small concentric area around the origin (0, 0) as described above. Consequently, whereas the configuration in FIG. 15 requires a supply voltage of around 4 V to be applied, the configuration in FIG. 18 requires only 3 V or less even if load conditions near the antenna 1306 are the same.

Incidentally, although in the embodiment described above, the memory means (which corresponds to the storage means of the present invention) is installed in the control circuit 2109, it may be installed anywhere else.

Besides, when changing the collector or drain voltage of the transistor in the power amplifier according to the load variations on the output side, it is desirable to use a step-up/step-down DC/DC converter, but a step-down DC/DC converter or step-up DC/DC converter may also be used.

Besides, it is also possible to vary the voltage supplied to the transistor in such a manner as described in relation to this embodiment, according to instantaneous power of the power amplifier. Specifically, when the instantaneous power of the power amplifier is high, the voltage supplied to the transistor can be raised by the step-up operation of the step-up/step-down DC/DC converter. It can be expected that this will also correct distortion in the output power of the power amplifier.

Today, portable telephone terminals are growing in functionality with various functions added to them and their power consumption is on the increase compared to earlier portable telephone terminals. Lithium ion batteries are often used for portable telephone terminals and the like. However, lithium ion batteries made of currently available materials do not provide sufficient capacity for such high-function portable telephone terminals. Thus, it is hoped that batteries made of new materials, including batteries with their positive and negative poles made of materials different from current ones will be used as power sources. However, such batteries made of new materials will deliver output voltages lower than 3.7 V of lithium ion batteries. The power amplifier described in this embodiment is expected to play an important role in applying such batteries made of new materials to Wide Band CDMA and other similar systems, as power sources.

Figure 19:
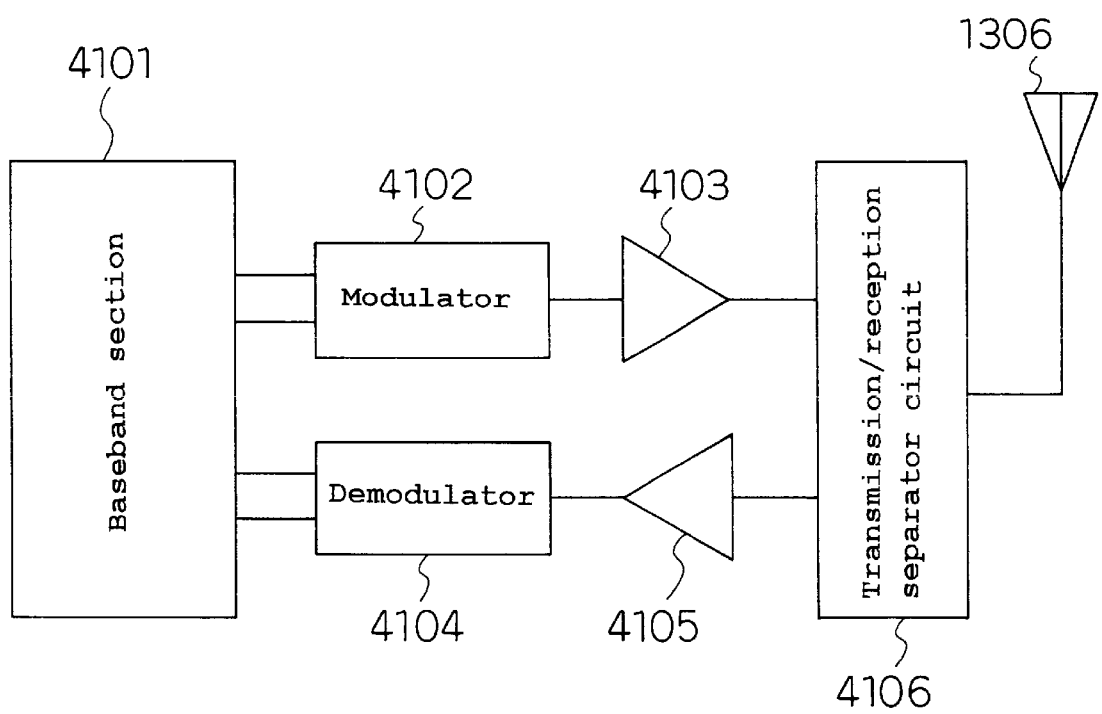
FIG. 19 a block diagram of a portable telephone terminal using a power amplifier circuit of the present invention.

The portable telephone terminals described above can be configured, as shown in FIG. 19, for example, to comprise (a) the antenna 1306 used for transmission and reception; (b) transmission circuit which includes a modulator 4102 and a transmission amplifier 4103 (which corresponds to the power amplifier circuit of the present invention) for outputting transmission signals from the antenna 1306 via a transmission/reception separator circuit 4106; (c) reception circuit which includes a demodulator 4104 and a reception amplifier 4105 for amplifying signals received from the antenna 1306 via the transmission/reception separator circuit 4106; and (d) baseband section 4101.

The same effects as those described above can be achieved by creating a program which makes a computer execute the functions of all or part of the means (or devices, elements, circuits, parts, etc.) provided in the power amplifier circuit of the present invention, including at least the load impedance detecting means and control means, and which operates in collaboration with a computer, and by running it on hardware such as a built-in CPU (computer) of a portable telephone terminal.

Also, the same effects as those described above can be achieved by creating a program which makes a computer execute the operations of all or part of the steps (or processes, operations, actions, etc.) in the control method of the power amplifier circuit of the present invention and which operates in collaboration with a computer, and by running it on hardware such as a built-in CPU (computer) of a portable telephone terminal.

Also, the same effects as those described above can be achieved by constructing a computer-readable medium containing the above program, which when read by a computer, executes the above described functions in collaboration with the computer.

Incidentally, part of the means (or devices, elements, circuits, parts, etc.) provided in the present invention and part of the steps (or processes, operations, actions, etc.) provided in the present invention described above mean some of the multiple means and steps, or part of functions or part of operations in one means or step.

Also, a program use form as a technology related to the present invention may be such that the program is recorded in a computer-readable recording medium and operated in collaboration with a computer.

Also, the above-mentioned program use form may be such that the program is transmitted in a transmission medium, read by a computer, and operated in collaboration with the computer.

Also, the recording medium above may be a ROM or the like while the transmission medium may be the Internet as well as light, radio waves, acoustic waves, or the like.

Also, the above-mentioned computer according to the present invention is not limited to pure hardware such as a CPU, and it may include firmware, an OS, and peripherals.

Besides, the configuration of the present invention may be implemented by either software or hardware, as described above.

The individual inventions disclosed herein are interrelated as follows:

A first invention is a power amplifier circuit, comprising:
a first matching circuit which impedance-matches incoming input signals before outputting them;
a first bias circuit connected to an output of the above described first matching circuit;
a transistor connected to the output of the above described first matching circuit;
a second bias circuit one end of which is connected to an output of the above described transistor;
a second matching circuit which is connected to the output of the above described transistor and impedance-matches output signals of the above described transistor before outputting them;
a step-up/step-down DC/DC converter whose output is connected to the other end of the above described second bias circuit and whose input is connected with a power supply; and control means of controlling operation of the above described step-up/step-down DC/DC converter, wherein the above described step-up/step-down DC/DC converter delivers output voltage under the control of the above described control means, and the above described step-up/step-down DC/DC converter performs a step-up operation of raising the above described output voltage above a preset supply voltage and a step-down operation of lowering the above described output voltage below the above described supply voltage.

A second invention is a power amplifier circuit according to the first invention, comprising:

switching means of routing the output of the above described step-up/step-down DC/DC converter to the other end of the above described second bias circuit, wherein there are a plurality of the above described step-up/step-down DC/DC converters, all or part of the inputs of the above described step-up/step-down DC/DC converters are connected with a power supply different from the other step-up/step-down DC/DC converters, the above described control means also controls operation of the above described switching means, and the above described switching means routes the output of step-up/step-down DC/DC converters specified by control of the above described control means from among the above described plurality of step-up/step-down DC/DC converters to the other end of the above described second bias circuit.

A third invention is a power amplifier circuit according to the first or second invention, wherein the above described supply voltage is set to a value between the output voltage of the above described step-up/step-down DC/DC converter which corresponds to the maximum output power of the above described transistor and the output voltage of the above described step-up/step-down DC/DC converter which corresponds to the minimum output power of the above described transistor.

A fourth invention is a power amplifier circuit according to the third invention, wherein the above described supply voltage is set to a value between the output voltage of the above described step-up/step-down DC/DC converter which corresponds to the most frequently used output power of the above described transistor and the output voltage of the above described step-up/step-down DC/DC converter which corresponds to the maximum output power of the above described transistor.

A fifth invention is a power amplifier circuit according to the third invention, wherein the above described supply voltage is set to a value lower than the center between the output voltage of the above described step-up/step-down DC/DC converter which corresponds to the maximum output power of the above described transistor and the output voltage of the above described step-up/step-down DC/DC converter which corresponds to the minimum output power of the above described transistor.

A sixth invention is a power amplifier circuit according to any of the first to fifth inventions, wherein the above described control means varies the output voltage of the above described step-up/step-down DC/DC converter according to the magnitude of the output power of the above described transistor.

A seventh invention is a power amplifier circuit according to the sixth invention, wherein the above described control means controls the output voltage of the above described step-up/step-down DC/DC converter in such a way as to set it higher when the magnitude of the output power from the above described transistor is large than when the magnitude of the output power from the above described transistor is small.

An eighth invention is a power amplifier circuit according to any of the first to fifth inventions, wherein the above described control means varies the output voltage of the above described step-up/step-down DC/DC converter according to the magnitude of the input power to the above described transistor.

A ninth invention is a power amplifier circuit according to the eighth invention, wherein the above described control means controls the output voltage of the above described step-up/step-down DC/DC converter in such a way as to set it higher when the magnitude of the above described input power to the above described transistor is large than when the magnitude of the input power to the above described transistor is small.

A tenth invention is a power amplifier circuit according to any of the first to fifth inventions, wherein the above described control means:

is connected to a baseband section which outputs baseband signals;

detects the input power to the above described transistor based on the above described baseband signals outputted; and controls the above described step-up/step-down DC/DC converter according to the magnitude of the detected input power.

An eleventh invention is a power amplifier circuit according to the tenth invention, wherein the above described control means controls the output voltage of the above described step-up/step-down DC/DC converter in such a way as to set it higher when the magnitude of the above described input power detected is large than when the magnitude of the above described input power is small.

A twelfth invention is a power amplifier circuit according to the sixth or seventh invention, comprising:

a divider whose first output is connected to an output of the above described second matching circuit; and detector whose input is connected to one output of the above described divider and which is intended to detect the magnitude of signals, wherein an output of the above described detector is connected to the above described control means, and the output power from the above described transistor is output power from the above described detector.

A thirteenth invention is a power amplifier circuit according to the ninth or tenth invention, comprising:

a divider whose one output is connected to an input of the above described first matching circuit; and detector whose input is connected to another output of the above described divider and which is intended to detect the magnitude of signals, wherein an output of the above described detector is connected to the above described control means, and the input power to the above described transistor is output power from the above described detector.

A fourteenth invention is a power amplifier circuit according to any of the first to fifth inventions, wherein the above described control means varies the output voltage of the above described step-up/step-down DC/DC converter according to the modulation type of the above described input signals, carrier frequency of the above described input signals, or load variations of the above described transistor.

A fifteenth invention is a power amplifier circuit according to the second invention, wherein the above described control means switches between the above described step-up/step-down DC/DC converters according to the output power from the above described transistor, input power to the above described transistor, modulation type of the above described input signals, carrier frequency of the above described input signals, or load variations of the above described transistor, by making the above described switching means connect the output of a selected step-up/step-down DC/Dc converter to the other end of the above described second bias circuit.

A sixteenth invention is a power amplifier circuit according to any of the first to fifteenth inventions, wherein:
  the impedance of the above described first and/or second matching circuits is variable; and
  the above described control means also controls the above described first and/or second matching circuits according to the output power from the above described transistor, input power to the above described transistor, modulation type of the above described input signals, carrier frequency of the above described input signals, or load variations of the above described transistor.

A seventeenth invention is a power amplifier circuit wherein:
  the power amplifier circuits according to any of the first to sixteenth inventions are connected in multiple stages; and
  control means of the power amplifier circuit in each of the above described stages separately controls the output voltage of the step-up/step-down DC/DC converter in each of the above described stages.

An eighteenth invention is a power amplifier circuit comprising:
  a first matching circuit which impedance-matches incoming input signals before outputting them;
  a first bias circuit connected to an output of the above described first matching circuit;
  a transistor connected to the output of the above described first matching circuit;
  a second bias circuit one end of which is connected to an output of the above described transistor;
  a second matching circuit which is connected to the output of the above described transistor and impedance-matches output signals of the above described transistor before outputting them;
  voltage transformation means whose output is connected to the other end of the above described second bias circuit and whose input is connected with a power supply; and
  control means of controlling operation of the above described voltage transformation means,
  wherein the above described voltage transformation means delivers output voltage under the control of the above described control means, and
  the above described control means varies output voltage of the above described voltage transformation means according to the load on the output side of the above described power amplifier circuit.

A nineteenth invention is a power amplifier circuit according to the eighteenth invention, comprising:
  switching means of routing the output of the above described voltage transformation means to the other end of the above described second bias circuit,
  wherein there are a plurality of the above described voltage transformation means,
  all or part of the inputs of the above described voltage transformation means are connected with a power supply different from the other voltage transformation means,
  the above described control means also controls operation of the above described switching means, and
  the above described switching means routes the output of voltage transformation means specified by control of the above described control means from among the above described plurality of voltage transformation means to the other end of the above described second bias circuit under the control of the above described control means.

A twentieth invention is a power amplifier circuit according to the eighteenth or nineteenth invention, wherein the above described control means controls the output voltage of the above described voltage transformation means in such a way as to set it higher when the load variations on the output side of the power amplifier circuit is large than when the load variations on the output side of the power amplifier circuit is small.

A twenty-first invention is a power amplifier circuit according to any of the eighteenth to twentieth inventions, wherein:
  the impedance of the above described first and/or second matching circuits is variable; and
  the above described control means controls the above described first and/or second matching circuits according to the load on the output side of the power amplifier circuit.

A twenty-second invention is a power amplifier circuit according to any of the eighteenth to twenty-first inventions, wherein:
  the above described voltage transformation means is a step-up/step-down DC/DC converter which performs a step-up operation of raising its output voltage above the above described supply voltage and a step-down operation of lowering its output voltage below the above described supply voltage, a step-up DC/DC converter which performs a step-up operation of raising its output voltage above the above described supply voltage, or a step-down DC/DC converter which performs a step-down operation of lowering its output voltage below the above described supply voltage.

The above configuration provides high efficiency even if the operating state of the power amplifier changes.

Also, the above configuration provides high efficiency over a wide output dynamic range.

Also, the above configuration can control the step-up/step-down DC/DC converter properly by detecting the input power and output power of the power amplifier.

Also, the above configuration can operate the power amplifier at high efficiency even if the modulation scheme or carrier frequency changes.

Also, the above configuration can operate the power amplifier (power amplifier circuit) at high efficiency even if the output voltage changes.

Also, the above configuration can operate the power amplifier (power amplifier circuit) at high efficiency even if the modulation type or carrier frequency changes.

Also, the above configuration can implement a highly efficient power amplifier (power amplifier circuit) even when large gains are required.

Also, the above configuration can reduce efficiency degradation even if no isolator is provided at the output of the power amplifier and there are load variations.

Also, the above configuration can achieve high efficiency as a whole in the case of wide dynamic range.

Also, the above configuration can implement a highly efficient power amplifier (power amplifier circuit) as a whole by making supply voltage selectable.

As can be seen from the above description, the present invention has the advantage of being able to achieve good characteristics over a wide range of load impedance using a smaller circuit scale than conventional ones.

Also, the present invention has the advantage of being able provide a highly efficient power amplifier circuit with a wide dynamic range, a control method for the power amplifier circuit, and a portable terminal apparatus using the power amplifier circuit.

What is claimed is:

1. A power amplifier circuit, comprising:
    a first matching circuit which impedance-matches incoming input signals before outputting them;
    a first bias circuit connected to an output of said first matching circuit;
    a transistor connected to the output of said first matching circuit;
    a second bias circuit one end of which is connected to an output of said transistor;
    a second matching circuit which is connected to the output of said transistor and impedance-matches output signals of said transistor before outputting them;
    voltage transformation means whose output is connected to an other end of said second bias circuit and whose input is connected with a power supply; and
    control means of controlling operation of said voltage transformation means,
    wherein said power amplifier circuit further comprises load impedance detecting means of detecting the load impedance on the output side of said power amplifier circuit,
    said control means changes output voltage of said voltage transformation means based at least on the results of said detection by said load impedance detecting means, and
    said output voltage is applied to said transistor as a supply voltage.

2. The power amplifier circuit according to claim 1, further comprising an isolator disposed between said load impedance detecting means and an antenna.

3. The power amplifier circuit according to claim 1 or 2, wherein said load impedance detecting means comprises:
    (1) a directional coupler which outputs a signal from one terminal according to received signal outputted from said second matching circuit to a load side and outputs a signal from the other terminal according to reflected waves inputted from said load side;
    (2) a first detector which outputs data on the amplitude and phase of a signal outputted from said one terminal; and
    (3) a second detector which outputs data on the amplitude and phase of a signal outputted from said other terminal.

4. The power amplifier circuit according to claim 1, wherein said control means controls the value of said supply voltage of said transistor according to the value of load impedance, which is the results of said detection by said load impedance detecting means.

5. The power amplifier circuit according to claim 4, wherein said control means comprises storage means of storing, as a table, data which represents correspondence between the value of said load impedance and the value of said supply voltage and which is used for said control.

6. A power amplifier circuit, comprising:
    a first matching circuit which impedance-matches incoming input signals before outputting them;
    a first bias circuit connected to an output of said first matching circuit;
    a transistor connected to the output of said first matching circuit;
    a second bias circuit one end of which is connected to an output of said transistor;
    a second matching circuit which is connected to the output of said transistor and impedance-matches output signals of said transistor before outputting them;
    voltage transformation means whose output is connected to an other end of said second bias circuit and whose input is connected with a power supply; and
    control means of controlling operation of said voltage transformation means,
    wherein said voltage transformation means delivers output voltage under the control of said control means, and
    said control means determines according to output power from said power amplifier circuit whether to make said voltage transformation means carry out a step-up operation of raising said output voltage above a preset supply voltage or a step-down operation of lowering said output voltage below said supply voltage.

7. The power amplifier circuit according to claim 1, wherein said control means controls the value of said supply voltage of said transistor according to the value of load impedance, which is the results of said detection by said load impedance detecting means, as well as to the value of output power of said power amplifier circuit.

8. The power amplifier circuit according to claim 7, wherein said control means comprises storage means of storing, as a table in accordance with said output power, data which represents correspondence between the value of said load impedance and the value of said supply voltage and which is used for said control.

9. The power amplifier circuit according to claim 1 or 6, wherein said voltage transformation means is a DC/DC converter.

10. The power amplifier circuit according to claim 9, wherein said DC/DC converter is of a step-up/step-down type.

11. A control method for a power amplifier circuit which comprises:
    (1) a first matching circuit which impedance-matches incoming input signals before outputting them;
    (2) a first bias circuit connected to an output of said first matching circuit;
    (3) a transistor connected to the output of said first matching circuit;
    (4) a second bias circuit one end of which is connected to an output of said transistor;
    (5) a second matching circuit which is connected to the output of said transistor and impedance-matches output signals of said transistor before outputting them;
    (6) voltage transformation means whose output is connected to an other end of said second bias circuit and whose input is connected with a power supply; and
    (7) control means of controlling operation of said voltage transformation means, wherein load impedance on the output side of said power amplifier circuit is detected, said control means changes output voltage of said voltage transformation means based at least on said detected load impedance, and said output voltage is applied to said transistor as a supply voltage.

12. A portable terminal apparatus comprising:

an antenna used for transmission and reception;

transmitting circuit means including the power amplifier circuit according to claim 1 or 6 for outputting transmission signals from said antenna;

receiving circuit means for processing received signals from said antenna; and transmission/reception separator circuit means installed between said antenna and said transmitting circuit means and said receiving circuit means.

* * * * *